United States Patent
Kobayakawa

(10) Patent No.: US 7,952,381 B2
(45) Date of Patent: May 31, 2011

(54) SEMICONDUCTOR DEVICE

(75) Inventor: Junichi Kobayakawa, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/697,777

(22) Filed: Feb. 1, 2010

(65) Prior Publication Data

US 2010/0194427 A1    Aug. 5, 2010

(30) Foreign Application Priority Data

Feb. 2, 2009 (JP) ................... 2009-021303

(51) Int. Cl.
    *H03K 19/003* (2006.01)
    *H03K 17/16* (2006.01)
(52) U.S. Cl. .......................... 326/27; 326/82
(58) Field of Classification Search .............. 326/27, 326/30, 82, 83; 327/112, 170
See application file for complete search history.

(56) References Cited

U.S. PATENT DOCUMENTS

| | | | |
|---|---|---|---|
| 5,955,894 A * | 9/1999 | Vishwanthaiah et al. | 326/86 |
| 7,157,932 B2 * | 1/2007 | El-Kik et al. | 326/32 |
| 2003/0112042 A1 | 6/2003 | Takahashi | |
| 2005/0001653 A1 * | 1/2005 | Ahmad | 326/87 |
| 2005/0040845 A1 | 2/2005 | Park | |
| 2006/0158213 A1 * | 7/2006 | Allan | 326/30 |
| 2008/0079458 A1 * | 4/2008 | Shin et al. | 326/30 |

FOREIGN PATENT DOCUMENTS

| | | |
|---|---|---|
| JP | 10-050070 A | 2/1998 |
| JP | 2003-188705 A | 7/2003 |
| JP | 2005-65249 A | 3/2005 |

* cited by examiner

*Primary Examiner* — Daniel D Chang
(74) *Attorney, Agent, or Firm* — Arent Fox LLP

(57) ABSTRACT

A semiconductor device includes: a driver that receives a power supply voltage and drives an external load with a driving capability; a measurement unit that measures a level of the power supply voltage; a code table that stores the level of the power supply voltage and code information for determining the driving capability of the driver; and a controller that reads the code information in accordance with the level of a measured power supply voltage in reference to the code table and controls the driving capability of the driver in accordance with the code information.

7 Claims, 23 Drawing Sheets

FIG. 6

|  | Pch | | | | Nch | | | |
| --- | --- | --- | --- | --- | --- | --- | --- | --- |
|  | 0.00 V | 0.01 V | ... | 2.55 V | 0.00 V | 0.01 V | ... | 2.55 V |
| −128°C | 0(H) | 0(H) | ... | 2(H) | 4(H) | 4(H) | ... | 5(H) |
| −127°C | 1(H) | 1(H) | ... | 3(H) | 4(H) | 4(H) | ... | 5(H) |
| ⋮ | ⋮ | ⋮ | ⋮ | ⋮ | ⋮ | ⋮ | ⋮ | ⋮ |
| 127°C | 9(H) | 9(H) | ... | B(H) | 7(H) | 7(H) | ... | C(H) |

FIG. 7

| 20 | 17 16 | 15 | 8 7 | 0 |
| --- | --- | --- | --- | --- |
| PROCESS VARIATION | Pch/Nch TRANSISTOR | VOLTAGE | TEMPERATURE | |

FIG. 10
OFFSET = 0H
PROCESS 0 MAP GROUP
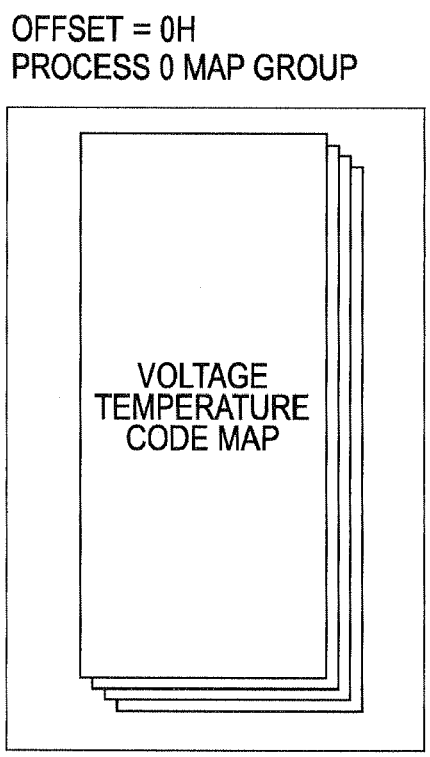
OFFSET = FH
PROCESS F MAP GROUP
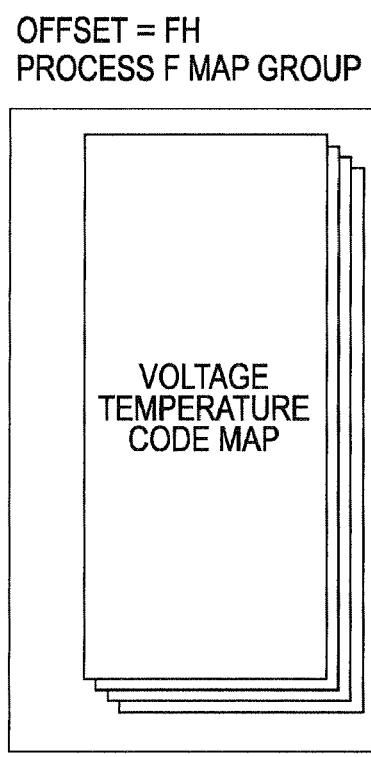

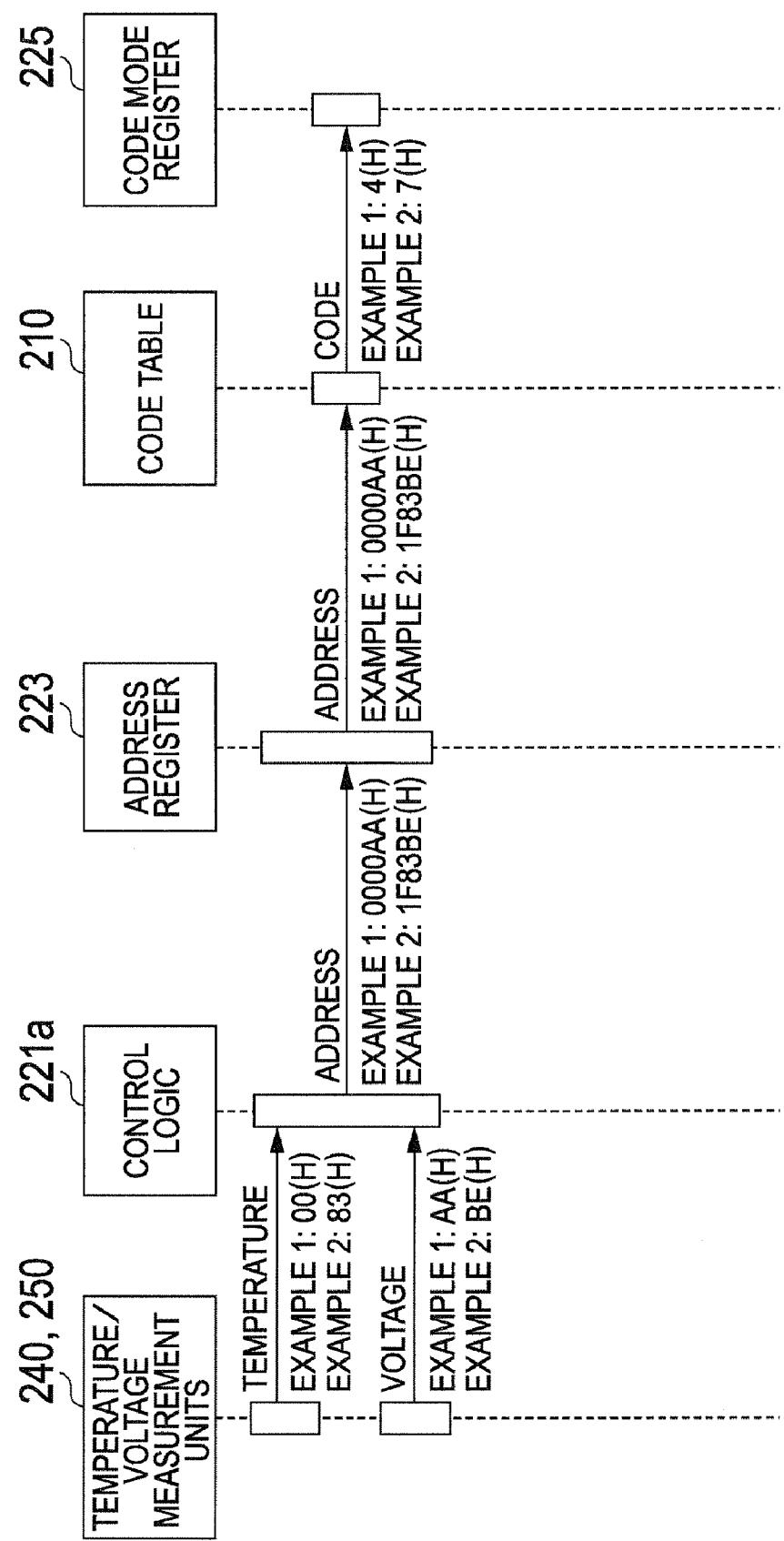

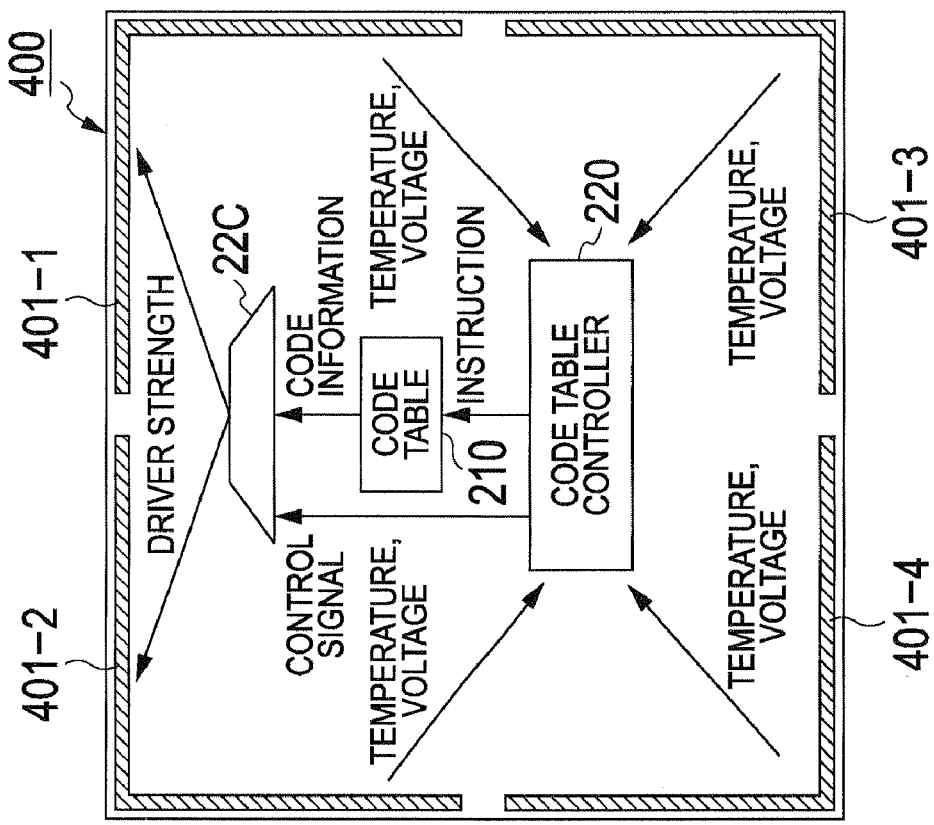
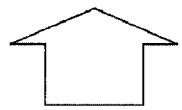
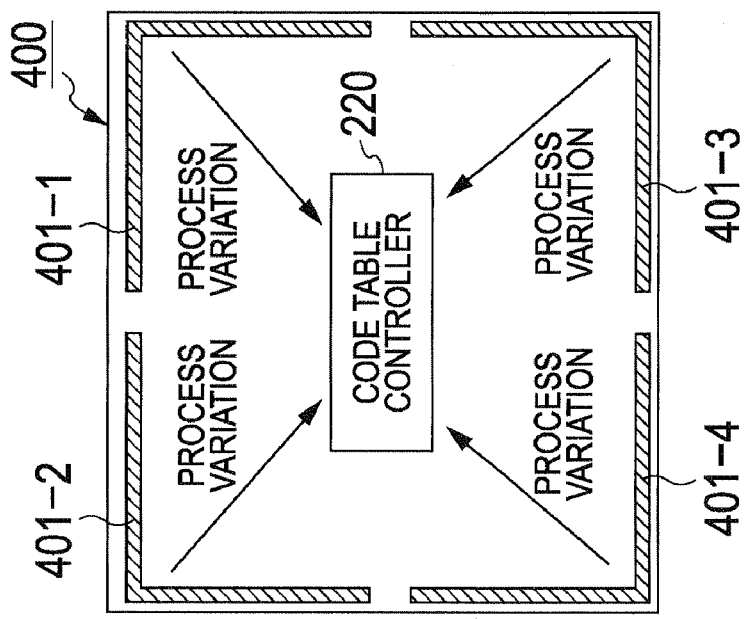

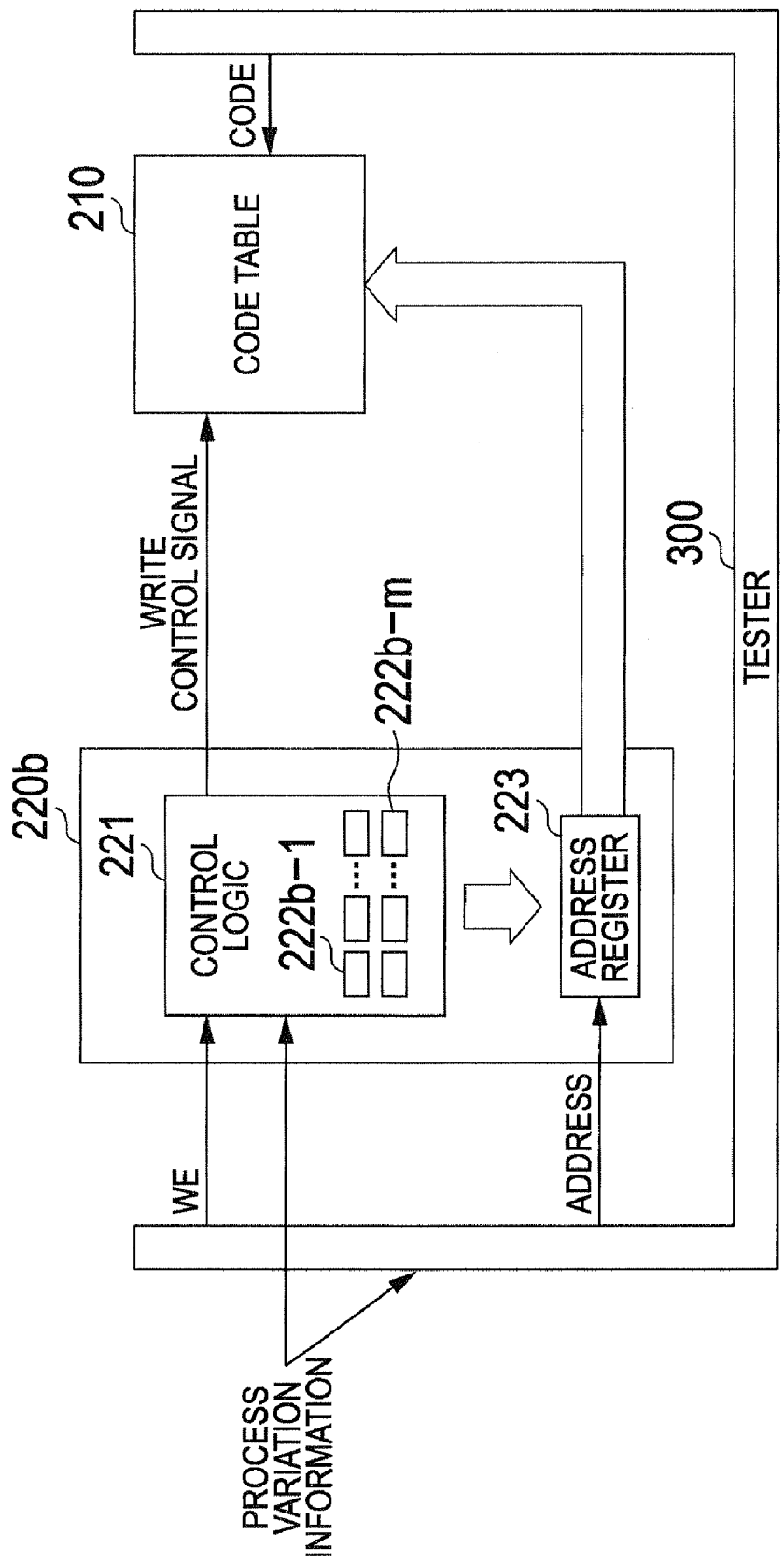

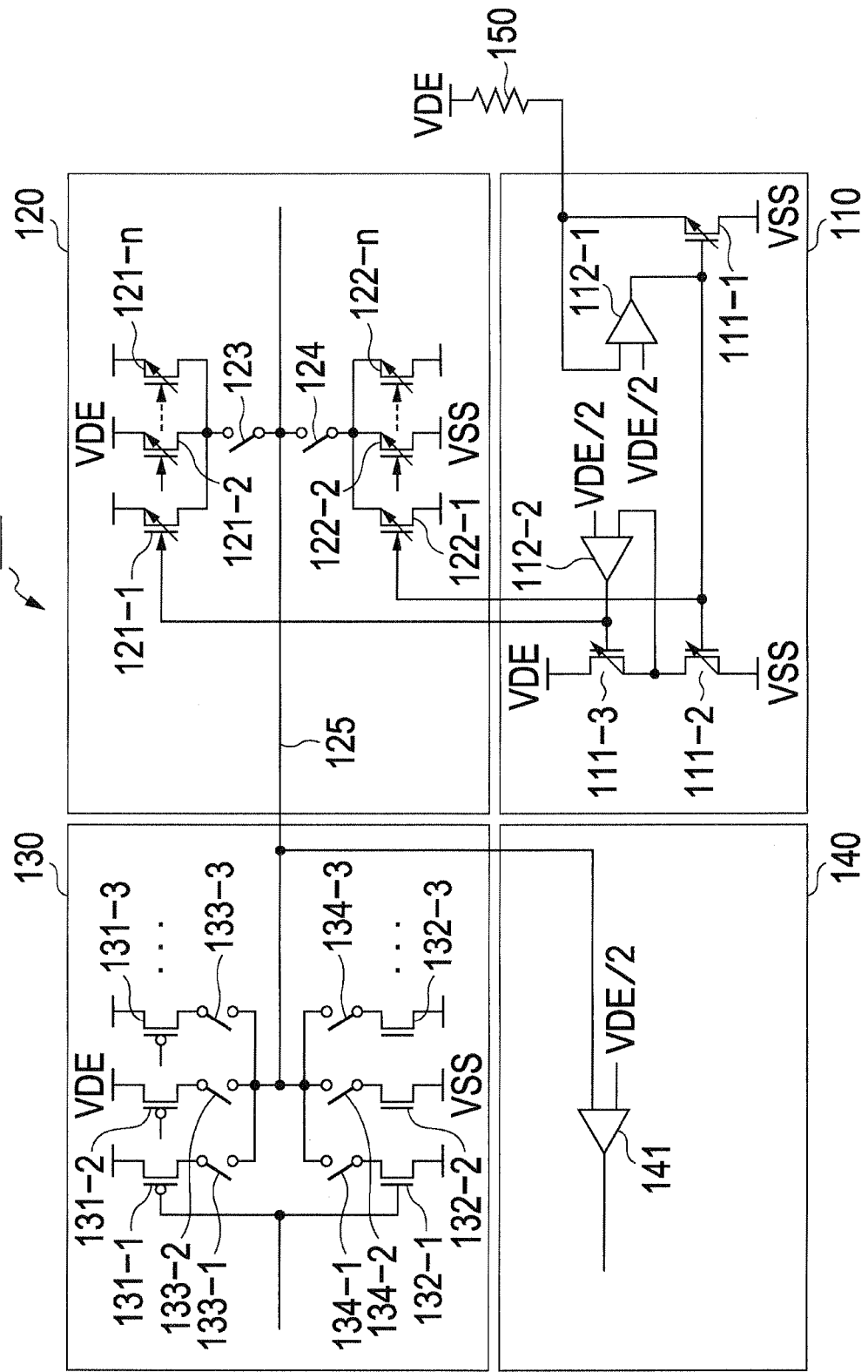

US 7,952,381 B2

SEMICONDUCTOR DEVICE

CROSS-REFERENCE TO RELATED APPLICATION

This application is based upon and claims the benefit of priority of the prior Japanese Patent Application No. 2009-021303 filed on Feb. 2, 2009, the entire contents of which are incorporated herein by reference.

FIELD

The embodiments herein are related to semiconductor devices.

BACKGROUND

As the operating frequency of a semiconductor device has increased year by year, it has become common to adjust the driving capability of the input, output, or input and output terminals of a semiconductor device. Adjusting a driving capability means adjusting the impedance of an output driver or an input driver in a semiconductor device and compensating for a voltage so that the respective resistances of a pull-up resistor and a pull-down resistor that constitute the driver of an output (or input) terminal become equal to each other.

Related art is discussed in Japanese Laid-open Patent Publication No. 10-50070, Japanese Laid-open Patent Publication No. 2003-188705, and Japanese Laid-open Patent Publication No. 2005-65249.

SUMMARY

According to an aspect of the embodiment, a semiconductor device includes: a driver that receives a power supply voltage and drives an external load with a driving capability; a measurement unit that measures a level of the power supply voltage; a code table that stores the level of the power supply voltage and code information for determining the driving capability of the driver; and a controller that reads the code information in accordance with the level of a measured power supply voltage in reference to the code table and controls the driving capability of the driver in accordance with the code information.

It is to be understood that both the foregoing general description and the following detailed description are exemplary and explanatory and are not restrictive of the invention, as claimed.

BRIEF DESCRIPTION OF DRAWINGS

FIG. 6 is a conceptual illustration illustrating an example of the structure of a code table;

FIG. 7 is a conceptual illustration of a bit map of an address set in an address register;

FIG. 10 is a third diagram illustrating memory maps when the code table is placed in a memory;

FIG. 14 is a sequence diagram illustrating the operations of the control logic, having the first configuration, reading code information from the code table;

FIGS. 15A and 15B are diagrams illustrating the meaning of having a plurality of process variation information registers;

FIG. 16 is a diagram illustrating the relationship between a code table controller having a second configuration and the tester when code information is written to the code table;

FIG. 24 is a block diagram of a known driving capability adjustment circuit.

DESCRIPTION OF EMBODIMENTS

Figure 1:
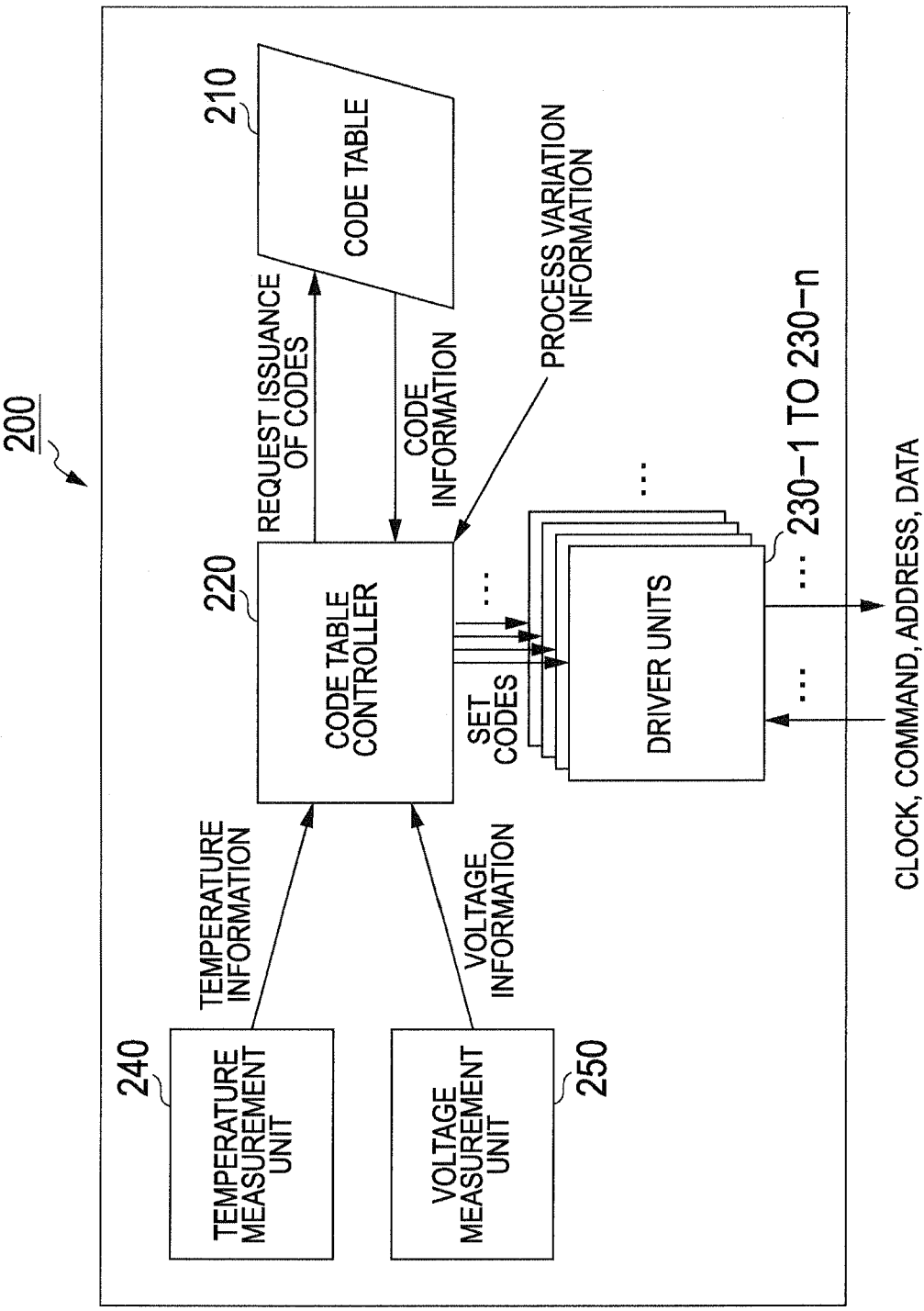
FIG. 1 is a diagram illustrating the outline configuration of a driving capability adjustment circuit according to an embodiment.

FIG. 24 is a block diagram of a known driving capability adjustment circuit adjusting a driving capability. A driving capability adjustment circuit 100 in FIG. 24 includes a reference resistance generation unit 110, a calibration unit 120, a code detection unit 130, a driving force comparison unit 140, and a control unit (not illustrated).

In FIG. 24, voltage VDE is a voltage for driving an interface, and voltage VSS is a zero-point ground voltage serving as a voltage reference. Moreover, an external resistor 150 is a highly accurate resistor connected to the exterior of a semiconductor device.

The reference resistance generation unit 110 copies the resistance of the external resistor 150 to internal reference resistors 111. Each of the reference resistors 111-1 to 111-3 constituting the reference resistance generation unit 110 is a transistor in which a resistance between the source and the drain varies with the level of a voltage input to the gate. Moreover, voltage VDE/2 is input to one side of each of the comparators 112-1 and 112-2, and the comparator changes the output value on the basis of the result of comparing voltage VDE/2 with the value of the input to the other side.

The calibration unit 120 decreases a reference resistance generated in the reference resistance generation unit 110 by a factor of n. The calibration unit 120 includes first target resistors 121-1 to 121-$n$ pulled up by voltage VDE and provided in parallel, the first target resistors 121-1 to 121-$n$ pulled up by voltage VDE and provided in parallel, second target resistors 122-1 to 122-$n$ pulled down by ground voltage VSS and provided in parallel, a first switch 123 switching between ON/OFF between the first target resistors 121-1 to 121-$n$ and a common line 125, and a second switch 124 switching between ON/OFF between the second target resistors 122-1 to 122-$n$ and the common line 125.

The code detection unit 130 detects the resistance of an input or output driver. The code detection unit 130 includes a plurality of Pch transistors 131-1 to 131-$m$ pulled up by voltage VDE, a plurality of Nch transistors 132-1 to 132-$m$ pulled down by ground voltage VSS, a plurality of third switches 133-1 to 133-$m$ switching between ON/OFF between the Pch transistors 131-1 to 131-$m$ and the common line 125, and a plurality of fourth switches 134-1 to 134-$m$ switching between ON/OFF between the Nch transistors 132-1 to 132-$m$ and the common line 125.

The driving force comparison unit 140 detects that the voltage of the common line reaches voltage VDE/2. The driving force comparison unit 140 includes a comparator 141 in which one input is VDE/2 and the other input is connected to the common line 125. The comparator 141 outputs the result of comparison to the control unit (not illustrated).

A known method for adjusting a driving capability, using the driving capability adjustment circuit 100 having such a configuration, will now be described.

When the driving capability of the input, output, or input and output terminals of a semiconductor device is adjusted, the driving capability adjustment circuit 100 first copies the resistance of the external resistor 150 to the reference resistors 111-1 and 111-2, using the comparator 112-1. Since voltage VDE/2 is input to one input of the comparator 112-1, and the voltage of a junction of the reference resistor 111-1 and the external resistor 150 pulled up by voltage VDE is input to the other input of the comparator 112-1, a resistance ratio between the external resistor 150 and the reference resistor 111-1 is set to 1:1 by adjusting the gate voltage. The resistance of the external resistor 150 is copied to the reference resistor 111-1 by this operation. Similarly, the value of the external resistor 150 is copied to the reference resistor 111-2 and the reference resistor 111-3, using the comparator 112-2.

The target resistors 121-1 to 121-$n$ and 122-1 to 122-$n$ are transistors in each of which the resistance is determined by the level of a voltage input to the gate, as is the case with the reference resistors 111-1 to 111-3. Thus, since the same voltage as the gate voltage of the reference resistor 111-3 is applied to the target resistors 121-1 to 121-$n$ in the calibration unit 120, the resistance of the reference resistor 111-3 is copied to the target resistors 121-1 to 121-$n$. Since the target resistors 121-1 to 121-$n$ are connected in parallel with each other, the total resistance of the target resistors 121-1 to 121-$n$ is one nth of the resistance of the reference resistor 111-3.

Similarly, since the same voltage as the gate voltage of the reference resistor 111-2 is applied to the target resistors 122-1 to 122-$n$, the resistance of the reference resistor 111-2 is copied to the target resistors 122-1 to 122-$n$. Since the target resistors 122-1 to 122-$n$ are connected in parallel with each other, the total resistance of the target resistors 122-1 to 122-$n$ is one nth of the resistance of the reference resistor 111-2.

Then, the control unit (not illustrated) first turns on the switch 123 and off the switch 124. The control unit further turns off all the switches 133-1 to 133-$m$ and all the switches 134-1 to 134-$m$. From this state, the control unit monitors the output of the comparator 141 in the driving force comparison unit 140 while turning on the switches 134-1 to 134-$m$ one by one. Then, the control unit stores, in a register, a code indicating the respective ON/OFF states of the switches 134-1 to 134-$m$ when the output of the comparator 141 is "H", i.e., when a resistance by the target resistors 121-1 to 121-$n$ matches a resistance by ones of the Nch transistors 132-1 to 132-$m$ in a state in which corresponding ones of the switches 134 are on.

Similarly, regarding the Pch transistors 131, the control unit first turns off the switch 123 and on the switch 124. The control unit further turns off all the switches 133-1 to 133-$m$ and all the switches 134-1 to 134-$m$. From this state, the control unit monitors the output of the comparator 141 in the driving force comparison unit 140 while turning on the switches 133-1 to 133-$m$ one by one. Then, the control unit stores, in a register, a code indicating the respective ON/OFF states of the switches 133-1 to 133-$m$ when the output of the comparator 141 is "H", i.e., when a resistance by the target resistors 122-1 to 122-$n$ matches a resistance by ones of the Pch transistors 131 in a state in which corresponding ones of the switches 133 are on.

Then, the control unit adjusts a driving capability by controlling the number of operating Pch transistors and Nch transistors that constitute the driver of a terminal the driving capability of which is to be adjusted on the basis of the codes indicating the respective ON/OFF states of the switches 133-1 to 133-$m$ and the switches 134-1 to 134-$m$ stored in the registers.

The aforementioned codes in the registers are used as long as the output resistance of Nch/Pch transistors in a semiconductor device does not change due to changes in the external environment such as the temperature and voltage.

Regardless of the process, voltage, and temperature, a constant driving capability can be obtained by properly performing driving capability adjustment, as described above.

FIG. 1 illustrates the outline configuration of a driving capability adjustment circuit 200 according to the embodiment.

The driving capability adjustment circuit 200 according to the embodiment includes a code table 210, a code table controller 220, driver units 230-1 to 230-$n$, a temperature measurement unit 240, and a voltage measurement unit 250.

The code table 210 is a table for storing a code indicating a driving capability to be set in each of the driver units 230-1 to 230-$n$ in association with the temperature of a semiconductor device chip including the driving capability adjustment circuit 200 according to the embodiment, the voltage of a terminal the driving capability of which is to be adjusted, and process variation information. The code table controller 220 is a controller referring to the code table 210 on the basis of the information of the temperature, the voltage, and the like indicated by the temperature measurement unit 240, the voltage measurement unit 250, and the like and process variation information and requesting issuance of a corresponding code. Then, the code table controller 220 sets codes obtained from the code table 210 in the driver units 230-1 to 230-$n$. Each of the driver units 230-1 to 230-$n$ is a control unit adjusting an input or output driver constituting a terminal the driving capability of which is to be adjusted and the driving capability. The driver units 230-1 to 230-n each change a resistance generated by Pch/Nch transistors constituting an input or output driver of a terminal on the basis of a code set by the code table controller 220. The temperature measurement unit 240 measures the temperature of a semiconductor device chip including the driving capability adjustment circuit 200 according to the embodiment or the temperature of a terminal the driving capability of which is to be adjusted and indicates the temperature to the code table controller 220. The voltage measurement unit 250 measures the voltage of a terminal the driving capability of which is to be adjusted and indicates the voltage to the code table controller 220.

In such a configuration, the driving capability adjustment circuit 200 according to the embodiment uses temperature information indicated by the temperature measurement unit 240, voltage information indicated by the voltage measurement unit 250, and process variation information obtained from the position of a terminal the driving capability of which is to be adjusted to obtain the information of a corresponding code from the code table 210. Then, the code table controller 220 adjusts, by setting the code in one of the driver units 230 for the terminal, the driving capability of which is to be adjusted, the driving capability of the terminal.

In this manner, in the driving capability adjustment circuit 200 according to the embodiment, a code to be set can be obtained merely by referring to the code table in a manner that depends on various types of information. Thus, rapid adjustment of a driving capability can be implemented. Moreover, adjustment of a driving capability does not take much time. Thus, a driving capability can be adjusted not only during the initialization of a semiconductor device but also during the operation.

Figure 2:
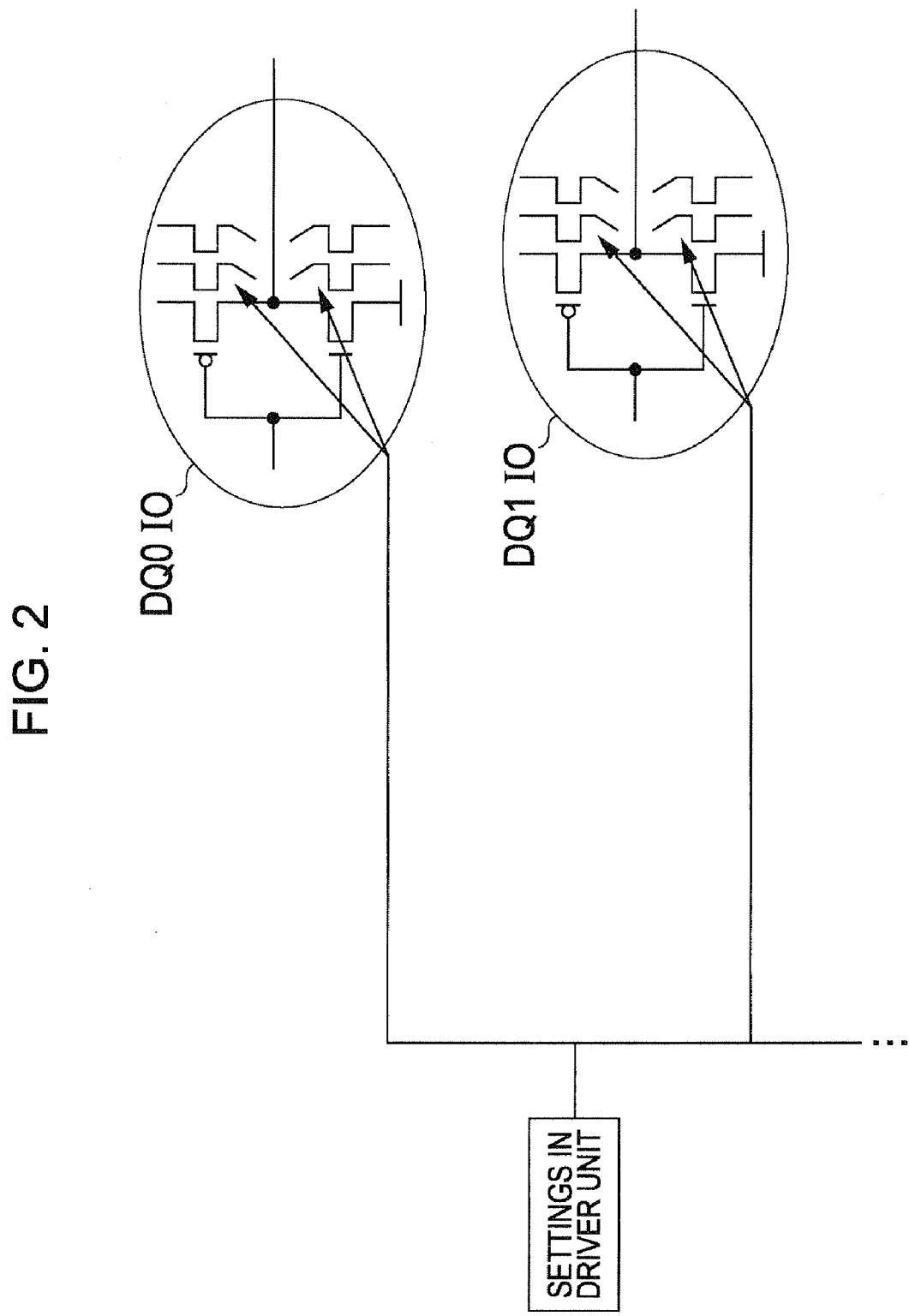
FIG. 2 is a diagram illustrating a method for adjusting a driving capability by driver units in the driving capability adjustment circuit according to the embodiment.

FIG. 2 illustrates a method for adjusting a driving capability by each of the driver units 230 in the driving capability adjustment circuit 200 according to the embodiment.

The driver unit 230 is provided for each terminal or each group of multiple terminals the driving capability of which is to be adjusted and adjusts, on the basis of code information set by the code table controller 220, the driving capability of a corresponding terminal.

In the driver unit 230, each of the group of multiple Pch transistors and the group of multiple Nch transistors are connected to a common line in parallel, and a control unit (not illustrated) adjusts the degree of parallelism by switching between ON/OFF of a switch connecting each of the Pch transistors and the Nch transistors on the basis of code information set by the code table controller 220, as illustrated in FIG. 2.

The driver unit 230 adjusts the number of connected Pch/Nch transistors constituting the driver of each terminal on the basis of settings set in the driver unit 230. The driving capability of each terminal is adjusted by this operation.

Figure 3:
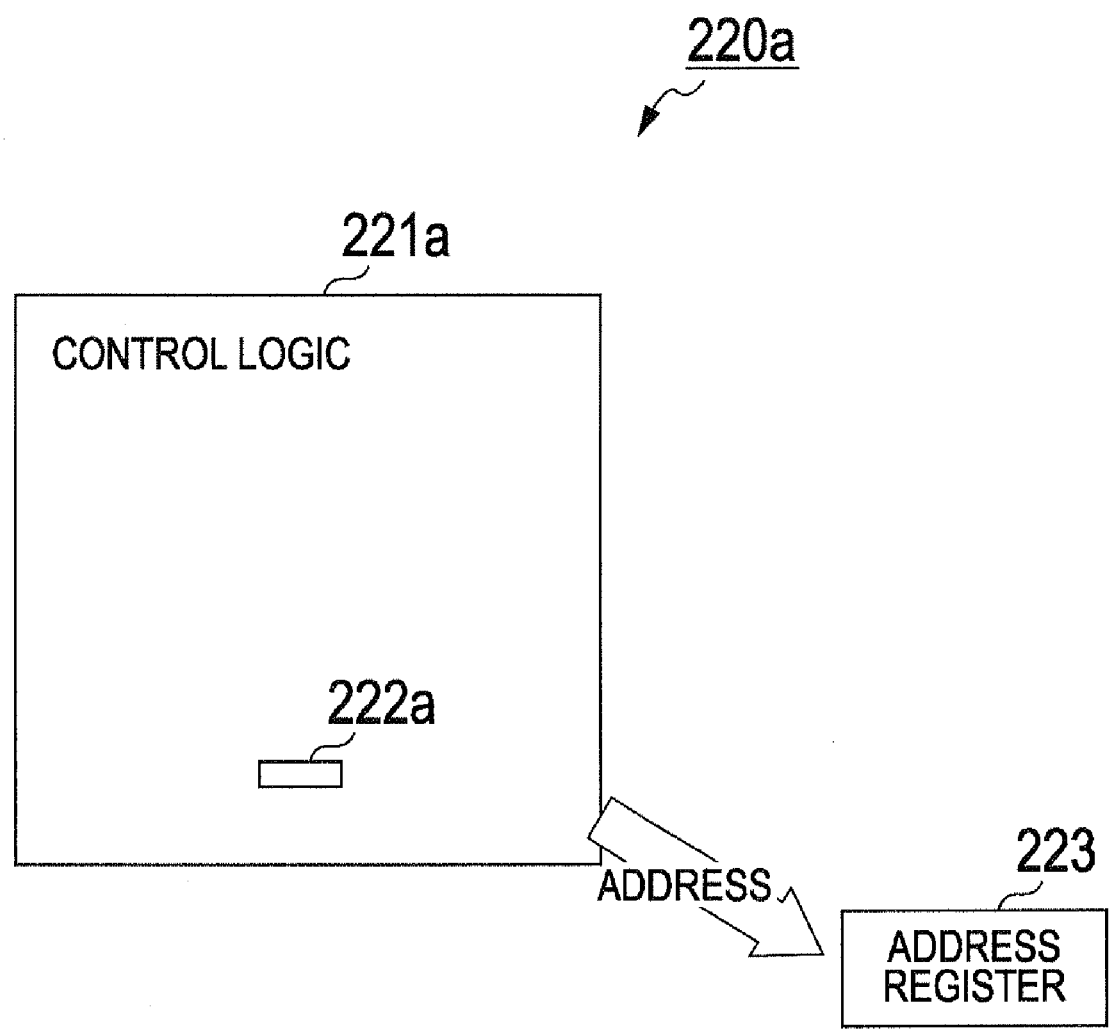
FIG. 3 is a diagram illustrating a first exemplary configuration of a code table controller.

FIG. 3 is a diagram illustrating a first exemplary configuration of the code table controller 220. In FIG. 3, a code table controller 220a includes control logic 221a, a process variation information register 222, and an address register 223.

The control logic 221a is a controller performing overall control of the code table controller 220. The process variation information register 222a is a register provided in the control logic 221 and stores information on variations in a process for each semiconductor wafer in which a semiconductor device including the driving capability adjustment circuit 200a according to the embodiment is formed. The address register 223 is a resistor storing an address value in the code table 210 used when the code table 210 is referred to.

In such a configuration, in the code table controller 220a, the control logic generates a reference address in the code table 210 in accordance with the temperature information measured by the temperature measurement unit 240, voltage information measured by the voltage measurement unit 250, and process variation information stored in the process variation information register 222a, and sets the reference address in the address register 223. The code table controller 220a obtains a code for adjusting a driving capability to be set in the driver units 230, referring to the code table 210 by the use of the address value set in the address register 223.

Figure 4:
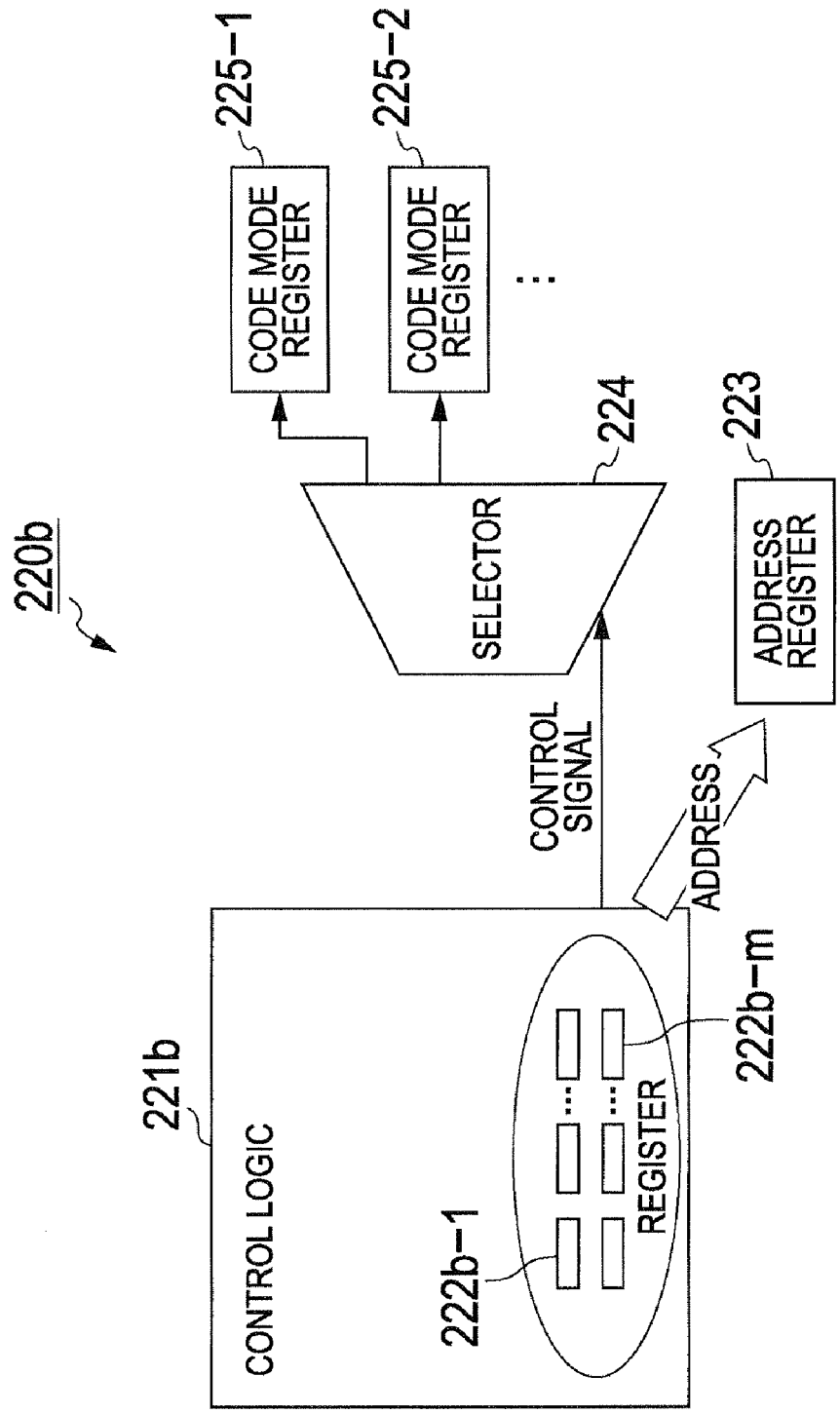
FIG. 4 is a diagram illustrating a second exemplary configuration of the code table controller.

FIG. 4 is a diagram illustrating a second exemplary configuration of the code table controller 220. A code table controller 220b having the second configuration illustrated in FIG. 4 includes control logic 221 and an address register 223, as is the case with the code table controller 220a having the first configuration in FIG. 3. The code table controller 220b further includes a plurality of process variation information registers 222b-1 to 222b-m, a selector 224, and a plurality of code mode registers 225-1 to 225-n.

The plurality of process variation information registers 222b-1 to 222b-m each store variation information for each position of a driver of a terminal the driving capability of which is to be adjusted instead of variations in a semiconductor wafer. Moreover, the code mode registers 225-1 to 225-n are provided for the driver units 230-1 to 230-n respectively and store codes to be set in the driver units 230-1 to 230-n. The selector 224 selects one of the code mode registers 225-1 to 225-n for storing a code read from the code table 210.

In the code table controller 220b having such a configuration, a reference address in the code table 210 is generated, using temperature information from the temperature measurement unit 240, voltage information from the voltage measurement unit 250, and process variation information read from the process variation information registers 222b-1 to 222b-m corresponding to the positional information of the driver of a terminal the driving capability of which is to be adjusted, and the reference address is set in the address register 223. The code table controller 220a obtains a code for adjusting a driving capability to be set in the driver units 230, referring to the code table 210 by the use of the address value set in the address register 223. Then, the control logic 221 controls the selector 224, using a control signal, so as to store the code read from the code table 210 in one of the code mode registers 225-1 to 225-n corresponding to one of the driver units 230-1 to 230-n the driving capability of which is to be adjusted. Then, the code table controller 220b adjusts driving capabilities by setting codes in the code mode registers 225-1 to 225-n in the corresponding driver units 230-1 to 230-n.

In this manner, in the code table controller 220b having the second configuration, a driving capability can be adjusted, considering not only the information of the temperature, the voltage, and the like but also process variations at the position of a terminal on a chip, the driving capability of the terminal being to be adjusted.

FIG. 5 is a diagram illustrating the outline of the operational flow of the driving capability adjustment circuit 200 according to the embodiment.

Figure 5A:
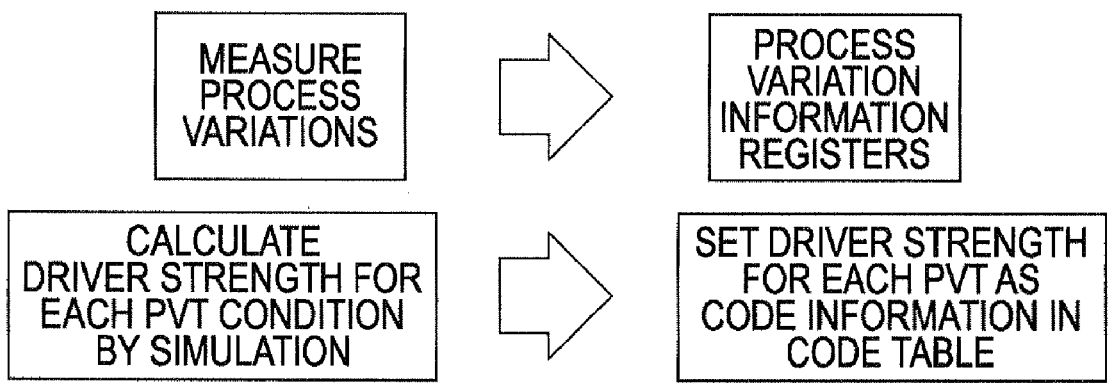
FIGS. 5A and 5B are diagrams illustrating the outline of the operational flow of the driving capability adjustment circuit according to the embodiment.
Figure 5B:
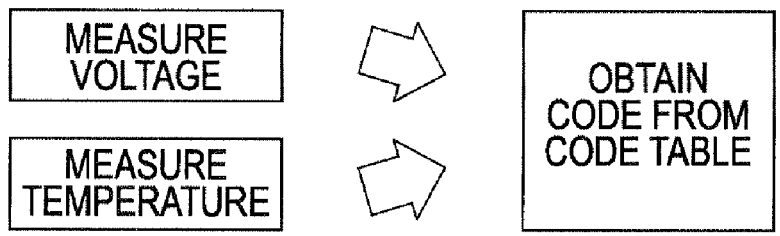

The operational flow in the driving capability adjustment circuit 200 can be divided into a flow during setup illustrated in FIG. 5A and a driving capability adjustment flow illustrated in FIG. 5B. The flow during setup in FIG. 5A illustrates operations performed when tests are performed on a semiconductor device including the driving capability adjustment circuit 200 according to the embodiment.

The driving capability adjustment flow in FIG. 5B illustrates operations of adjusting a driving capability during the use of a semiconductor device including the driving capability adjustment circuit 200 according to the embodiment.

In the flow during setup in FIG. 5A, process variation information for each wafer in which a semiconductor device chip is manufactured or process variation information at a plurality of positions on a chip is measured in the process of testing a semiconductor device. Possible methods for measuring process variations include a method in which a general purpose tester used in a test process is used, a method for measuring the frequency of a ring oscillator in which inverters are used, and length measurement. Then, codes based on the result of the measurement are set in the process variation information register 222a in FIG. 3 or the process variation information registers 222b-1 to 222b-m in FIG. 5 by a tester used in the test process.

Separately, optimal driving capability settings at different process variations (P), voltages (V), and temperatures (T) are obtained by simulations. The driving capability settings can be obtained by, for example, performing simulations for individual process-temperature-voltage sets on the basis of a library regarding process variations.

Simulations are first performed, changing the values of temperature, voltage, and the like, on the basis of a library regarding process variations. Then, it is checked, on the basis of the result of the simulations, whether there is any problem with the waveform quality, such as overshoot and undershoot, and timing. Then, optimal driving capability values in terms of the waveform quality and timing are determined on the basis of the result of the simulations. Then, the driving capability values are summarized for individual process-temperature-voltage sets.

The driving capability values are set and stored in the code table 210 as code information. Setting of code information in the code table 210 is performed by, for example, storing code information as a mask ROM or the like when a semiconductor device chip is made or writing code information to memory by the use of a tester in a test process.

In the driving capability adjustment flow illustrated in FIG. 5B, rapid adjustment of a driving capability can be implemented by obtaining code information, referring to the code table 210 on the basis of temperature information from the temperature measurement unit 240, voltage information from the voltage measurement unit 250, and settings in the process variation information register 222, and setting the code information in the driver units 230.

FIG. 6 is a conceptual illustration illustrating an example of the structure of the code table 210. In this example, the code table 210 is provided for each piece of process variation information. FIG. 6 illustrates the code table 210 in a case where process variation information is 0H (H indicates a hexadecimal. Hereinafter, the same applies). Since there are sixteen levels of process variation information, 0H to FH, in this example, the driving capability adjustment circuit 200 according to the embodiment includes sixteen types of the code table 210 as illustrated in FIG. 6 for the individual levels of process variation information.

The code table 210 in FIG. 6 is a table in which, for each of the Pch/Nch transistors constituting a driver, the range of driver voltages 0.00 V to 2.55 V of a terminal is set in units of 0.01 volts as the abscissa, and the range of temperatures −128° C. to 127° C. is set in units of 1 degrees centigrade as the ordinate, and code information corresponding to these temperatures and voltages is set.

In the code table 210 having such a structure, when process variation information, temperature information, and voltage information are indicated by the code table controller 220, the corresponding code table 210 is selected on the basis of the process variation information, and code information obtained by referring to the code table 210 on the basis of the temperature information and the voltage information is returned to the code table controller 220. Then, the code table controller 220 sets the code information in one of the driver units 230 for a terminal the driving capability of which is to be adjusted.

Thus, in the driving capability adjustment circuit 200 according to the embodiment, when process variation information, temperature information, and voltage information are determined, code information for adjusting a driving capability is uniquely obtained. Thus, adjustment of a driving capability can be performed much more rapidly than in the known techniques for adjusting a driving capability. Accordingly, even when a semiconductor device is operating or when burst transfer of data is being performed, a driving capability can be adjusted.

FIG. 7 is a conceptual illustration of a bit map of an address set in the address register 223. In FIG. 7, in an address set in the address register 223, bits 0 to 7, bits 8 to 15, bit 16, and bits 17 to 20 indicate temperature information, voltage information, a Pch/Nch transistor, and process variation information, respectively.

Figure 8:
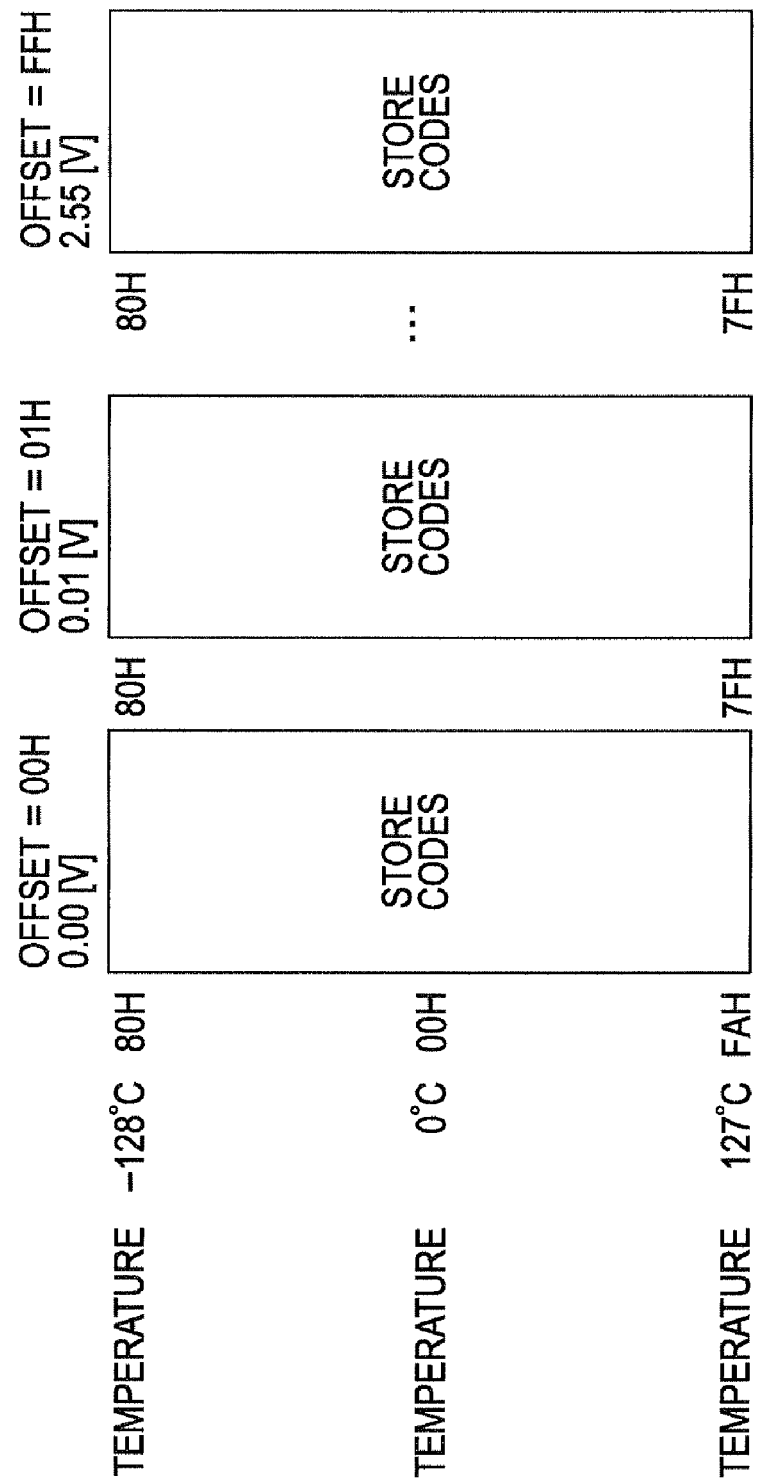
FIG. 8 is a first diagram illustrating memory maps when the code table is placed in a memory.

The code table 210 in FIG. 6 is placed in a memory, as illustrated in FIG. 8, so that a corresponding code can be obtained on the basis of such an address.

Figure 9:
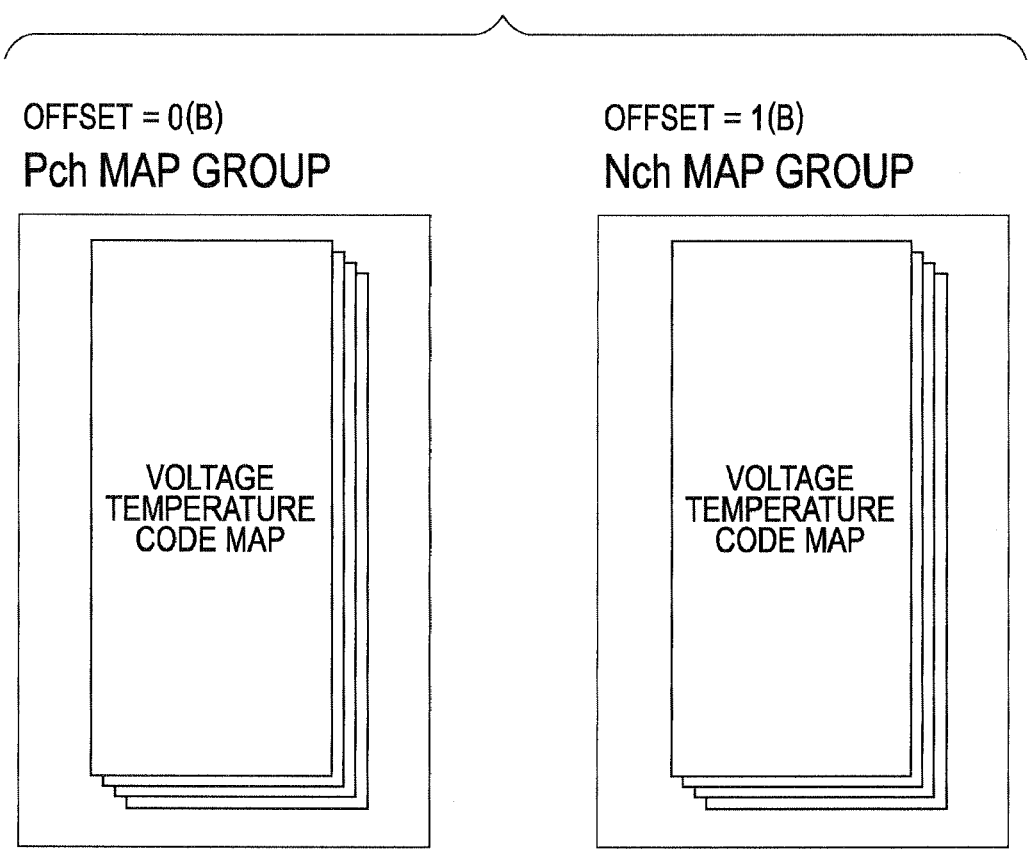
FIG. 9 is a second diagram illustrating memory maps when the code table is placed in a memory.

FIGS. 8 to 10 are diagrams illustrating memory maps when the code table 210 in FIG. 6 is placed in a memory.

FIG. 8 illustrates, by setting 00H to FFH as offsets, memory maps of code information corresponding to the values of temperatures ranging from −128° C. to 127° C. when the driver voltage of a terminal in a Pch transistor in process variation information 0H is 0.00 V, 0.01 V, . . . , 2.55 V, . . . , and when the driver voltage of a terminal in an Nch transistor in process variation information FH is 2.55 V. In this case, the code table 210 is expressed as 256 memory maps.

In FIG. 8, 7 FH-00H-80H that are values obtained by expressing temperatures −128° C. to 127° C. that are the temperature range in the embodiment as two's complements are used as the address values of temperatures. Thus, when temperature information is indicated by the temperature measurement unit 240, the code table controller 220 can obtain an address value in the code table 210 merely by converting the temperature information to a two's complement.

FIG. 9 is a diagram illustrating memory maps when the code table 210 is divided into a Pch transistor group and an Nch transistor group. In FIG. 9, in memory maps of the code table 210, code maps of code information of a Pch transistor with bit 16 of an address value being zero and code maps of code information of an Nch transistor with bit 16 of an address value being one are illustrated.

In the individual code maps in FIG. 9, code information corresponding to address values in which bits 15 to 8 are a voltage, and bits 7 to 0 are a temperature is stored.

FIG. 10 is a diagram illustrating memory maps when the code table 210 is divided according to process variation information. In FIG. 10, memory maps of the code table 210 are expressed, by setting 0H to FH as offsets, as sixteen process maps including a process map the process variation information of which is 0H to a process map the process variation information of which is FH.

In an address value illustrated in FIG. 7, the two's complement of temperature information and a value obtained by multiplying the value of a voltage by 100 and then converting the product to a binary are used in bits 0 to 7 and bits 8 to 15, respectively, and bit 16 is obtained by determining one or zero in a manner that depends on whether a corresponding transistor is a Pch or Nch transistor, as described above. Moreover, process variation information can be directly used as the values set as the offsets in FIG. 10.

The operations illustrated in FIG. 5A when code information is set in the code table 210 will next be described.

Figure 11:
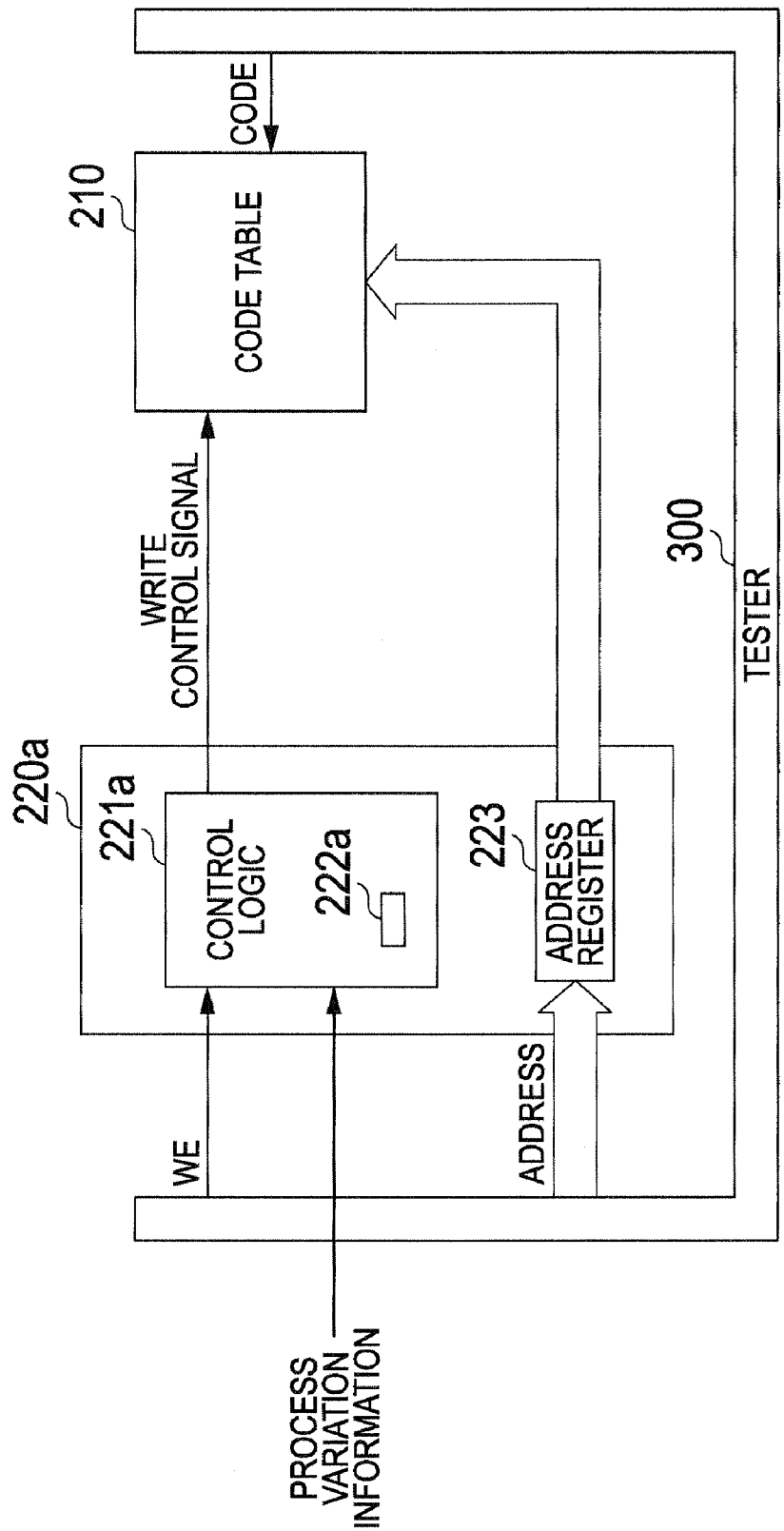
FIG. 11 is a diagram illustrating the relationship between the code table controller and a tester when code information is written to the code table.

FIG. 11 is a diagram illustrating the relationship between the code table controller 220a and a tester 300 when code information is written to the code table 210.

In FIG. 11, the tester or the like 300 testing a semiconductor device writes code information to the code table 210 via the control logic 221a of the code table controller 220a.

FIG. 11 illustrates, as an example, a case where the control logic 221a includes the single process variation information register 222a, as illustrated in FIG. 3. In FIG. 11, a signal WE is a control signal indicating write enable from the tester or the like 300 when a code is written to the code table 210. An address is a signal indicating address information of the code table 210 to which code information is written. A code is code information to be written from the tester or the like 300 to the code table 210 and used as information for adjusting a driving capability. Process variation information is information to be set in the process variation information register 222a in the control logic 221a.

In FIG. 11, when the signal WE is input to the control logic 221a by the tester 300 to indicate to the control logic 221a to perform writing to the code table 210, the control logic 221a outputs a write control signal to the code table 210. Moreover, the address register specifies a corresponding address in the code table 210 on the basis of an address value set by the tester 300. Moreover, when process variation information is input from the tester 300 to the control logic 221a, the process variation information is set in the process variation information register 222a.

Figure 12:
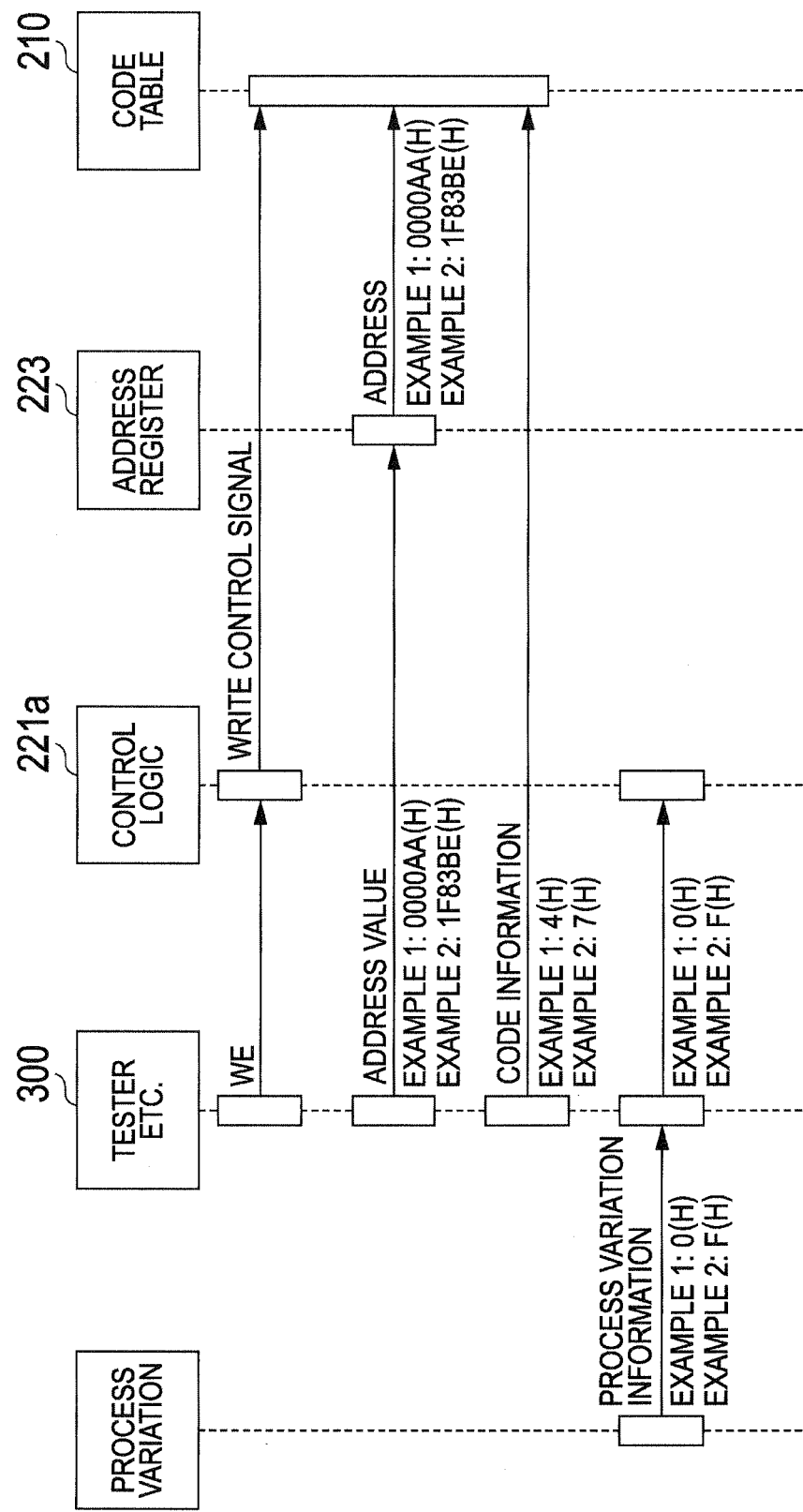
FIG. 12 is a diagram illustrating a sequence when information is written to the driving capability adjustment circuit, using the tester.

FIG. 12 is a diagram illustrating a sequence when information is written to the driving capability adjustment circuit 200, using the tester 300. When code information is written to the code table 210, the tester 300 first outputs the signal WE to the control logic 221a and sets, in the address register 223, an address value indicating an address to which writing is performed in the code table 210, as illustrated in FIG. 12. Then, the control logic 221a sends a write control signal to the code table 210 and specifies the position of an object to be subjected to writing in the code table 210 by the address value set in the address register 223. From such a state, the tester 300 writes the code information to the code table 210. Moreover, process variation information is set in the process variation information register 222a in the control logic 221a.

A first example in FIG. 12 illustrates a case where code information 4H is written to the code table 210 under the conditions of voltage 1.70 V, temperature 0° C., Pch, and process variation information 0H. In this case, process variation information 0H is written to the process variation information register 222a by the tester 300. An address value 0000AAH in the code table 210 obtained from the condition information of the voltage, the temperature, and the Pch or Nch transistor and the process variation information described above is set in the address register 223, and code information 4H is written to a position corresponding to the address value in the code table 210.

Moreover, a second example illustrates a case where code information 7H is written to the code table 210 under the conditions of voltage 1.90 V, temperature −25° C., Nch, and process variation information FH. In this case, process variation information 7H is written to the process variation information register 222a by the tester 300. An address value 1F83BEH in the code table 210 obtained from the condition information of the voltage, the temperature, and the Pch or Nch transistor and the process variation information described above is set in the address register 223, and code information 7H is written to a position corresponding to the address value in the code table 210.

A case where a semiconductor device including the driving capability adjustment circuit 200 according to the embodiment adjusts a driving capability during the operation will next be described.

Figure 13:
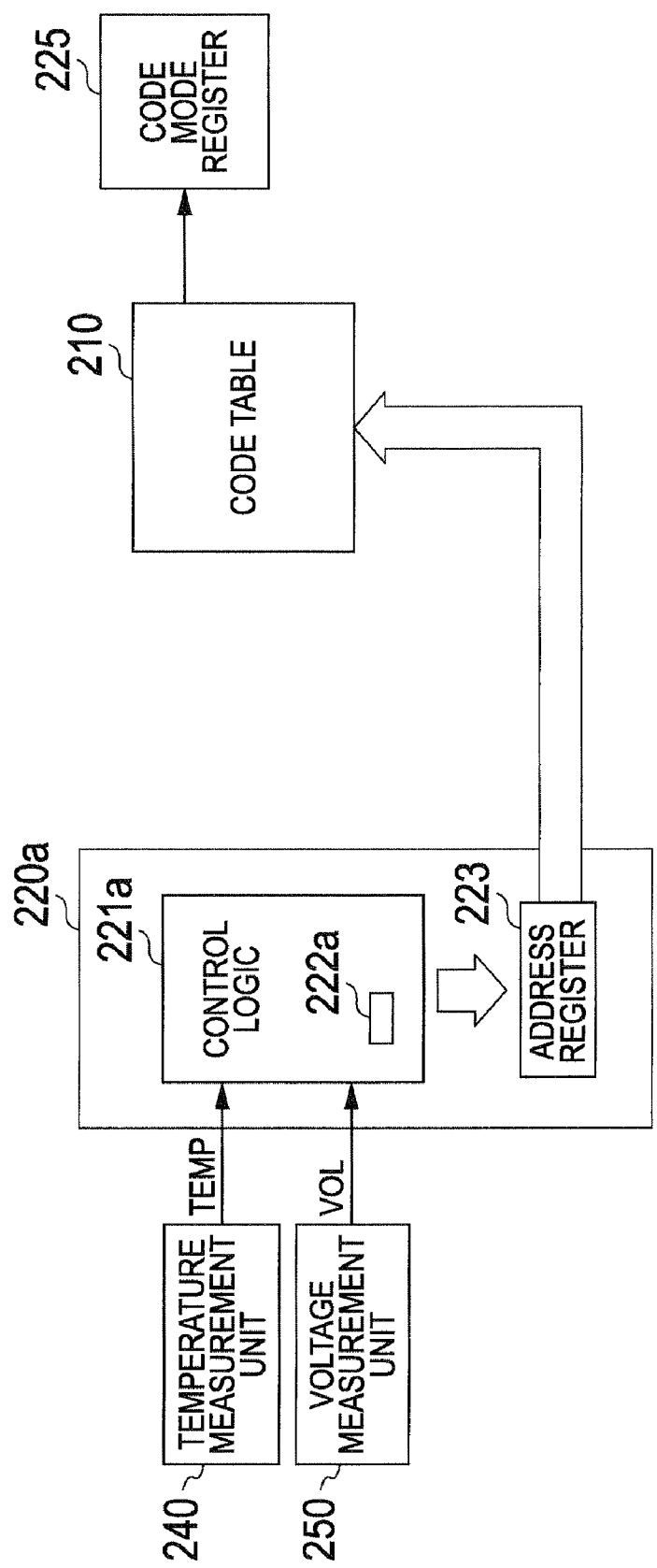
FIG. 13 is a conceptual illustration illustrating operations of a control logic, having a first configuration, reading code information from the code table.

FIG. 13 is a conceptual illustration illustrating operations of the control logic 221a reading code information from the code table 210 when the driving capability adjustment circuit 200 adjusts a driving capability while the semiconductor device is operating.

FIG. 13 illustrates, as an example, a case where the control logic 221a includes the single process variation information register 222a, as illustrated in FIG. 3. In FIG. 13, TEMP and VOL denote temperature information indicated by the temperature measurement unit 240 and voltage information indicated by the voltage measurement unit 250, respectively.

Temperature information from the temperature measurement unit 240 and voltage information from the voltage measurement unit 250 are indicated to the control logic 221a of the code table controller 220a. The control logic 221a generates address information of the code table 210 from the temperature information, the voltage information, and process variation information in the process variation information register 222a and sets the address information in the address register 223. Corresponding code information is read from the code table 210 and stored in the code mode registers 225 by this operation.

FIG. 14 is a sequence diagram illustrating the operations of the control logic 221 reading code information from the code table 210 when the driving capability adjustment circuit 200 adjusts a driving capability while the semiconductor device is operating illustrated in FIG. 13.

When the semiconductor device is operating, the information of a temperature and a voltage is indicated to the control logic 221a by the temperature measurement unit 240 and the voltage measurement unit 250 in real time, as illustrated in FIG. 14. The control logic 221a generates an address value on the basis of this information and a value set in the process variation information register 222a and sets the address value in the address register 223. Code information in a corresponding address in the code table 210 is read on the basis of the register value and set in the code mode registers 225. Then, the code information set in the code mode registers 225 is set in the driver units 230.

A first example in FIG. 14 illustrates a case where voltage information is 1.70 V, temperature information is 0° C., a transistor covered by a driver is a Pch transistor, and process variation information is 0H. In this case, 00H as temperature information and AAH as voltage information are indicated to the control logic 221a by the temperature measurement unit 240 and the voltage measurement unit 250, respectively. The control logic 221a generates an address value 0000AAH from these pieces of information, information indicating that a corresponding transistors is a Pch transistor, and process variation information 0H in the process variation information register 222a and sets the address value in the address register 223. Code information 4H is read from the position of the address 0000AAH in the code table 210 and set in the code mode registers 225 by this operation.

Moreover, a second example in FIG. 14 illustrates a case where voltage information is 1.90 V, temperature information is −25° C., a transistor covered by a driver is an Nch transistor, and process variation information is FH. In this case, 83H as temperature information and BEH as voltage information are indicated to the control logic 221a by the temperature measurement unit 240 and the voltage measurement unit 250, respectively. The control logic 221a generates an address value 1F83BEH from these pieces of information, information indicating that a corresponding transistors is an Nch transistor, and process variation information FH in the process variation information register 222a and sets the address value in the address register 223. Code information 7H is read from the position of the address 1F83BEH in the code table 210 and set in the code mode registers 225 by this operation.

In this arrangement, the driving capability adjustment circuit 200a according to the embodiment can adjust the driving capability of a terminal in a manner that depends on changes in the temperature and the voltage. Moreover, since this adjustment of a driving capability can be performed more rapidly than in known arts, even when a semiconductor device including the driving capability adjustment circuit 200a is operating or when data transfer is being performed, a driving capability can be adjusted.

The operations of setting information in the code table 210 and the process variation information registers 222b-1 to 222b-m in a case where the control logic 221 includes the plurality of process variation information registers 222b-1 to 222b-m, as illustrated in FIG. 4, will next be described.

FIGS. 15A and 15B are diagrams illustrating the meaning of having the plurality of process variation information registers 222b-1 to 222b-m. FIGS. 15A and 15B illustrate case where the four process variation information registers 222b-1 to 222b-4 are provided. In this case, a chip constituting a semiconductor device in the embodiment is divided into four parts, and the process variation information of the individual parts is stored in the four process variation information registers 222b-1 to 222b-4.

In FIG. 15A, terminals 401 of a semiconductor device are divided into at least one upper right terminal 401-1, at least one upper left terminal 401-2, at least one lower right terminal 401-3, and at least one lower left terminal 401-4 according to the respective positions of the terminals 401 on a chip 400. Then, process variations at the upper right, lower right, upper left, and lower left positions on the chip are measured, and process variation information based on the result of measurement is stored in the process variation information registers 222b-1 to 222b-4 in the code table controller 220.

In FIG. 15B, when the driving capability of each of the terminals 401-1 to 401-4 is adjusted during the operation of the semiconductor device, the code table controller 220 causes a code to be output from the code table 210 to the selector 224 on the basis of a temperature, a voltage, and the like around the terminal and process variation information in one of the process variation information registers 222b-1 to 222b-4 corresponding to the terminal. The code table controller 220 further controls the selector 224, using a control signal, so as to output the code information read from the code table 210 to one of the code mode registers at a position corresponding to the terminal, the driving capability of which is to be adjusted. In this arrangement, adjustment of a driving capability in which process variation information based on the position of each terminal is used can be performed.

FIG. 16 is a diagram illustrating the relationship between the code table controller 220b and the tester 300 when code information is written to the code table 210 in a case where the plurality of process variation information registers 222b-1 to 222b-m are provided.

In FIG. 16, the tester or the like 300 testing a semiconductor device writes code information to the code table 210 via the control logic 221b of the code table controller 220b.

Comparison of a conceptual illustration in FIG. 16 with a conceptual illustration in FIG. 11 illustrates that an operation of writing code information to the code table 210 in the case of FIG. 16 is the same as that in the case of FIG. 11. However, since the control logic 221b includes the plurality of process variation information registers 222b-1 to 222b-m, code values need to be set in all the plurality of process variation information registers 222b-1 to 222b-m. Thus, the tester 300 sequentially outputs process variation information to be set in each of the process variation information registers 222b-1 to 222b-m to the control logic 221b, and the control logic 221b sets each of the code values in a corresponding one of the process variation information registers 222b-1 to 222b-m.

Figure 17:
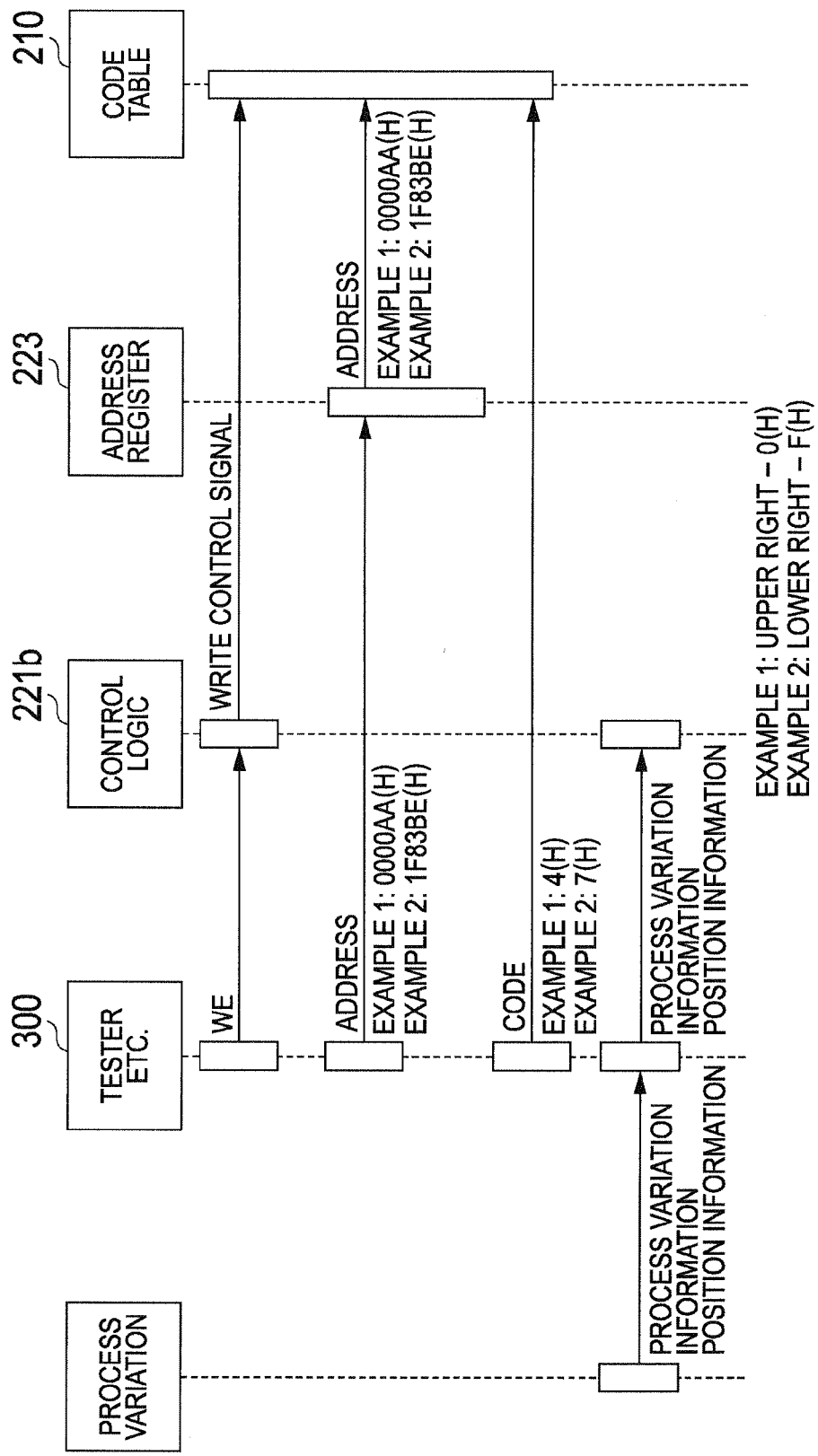
FIG. 17 is a diagram illustrating a sequence when a control logic having a second configuration writes information to a driving capability adjustment circuit, using the tester.

FIG. 17 is a diagram illustrating a sequence when the control logic 221b writes information to a driving capability adjustment circuit 200b including the plurality of process variation information registers 222b-1 to 222b-m, using the tester 300.

A sequence when the tester 300 writes code information to the code table 210 is the same as that in the case of FIG. 12, as illustrated in FIG. 17. In FIG. 17, at the time of writing the code information to the code table 210, the code value of process variation information corresponding to the information written to the code table 210 is set in a corresponding one of the plurality of process variation information registers 222b-1 to 222b-m.

A first example in FIG. 17 illustrates a case where, under the conditions of voltage 1.70 V, temperature 0° C., Pch, and process variation information 0H, code information 4H is written to the code table 210, and process variation information 0H is written to one of the plurality of process variation information registers 222b-1 to 222b-m corresponding to a driver provided on the upper right part of the chip. In this case, process variation information 0H is written to one of the process variation information registers 222b-1 to 222b-m corresponding to the driver provided on the upper right position of the chip by the tester 300.

Moreover, a second example illustrates a case where, under the conditions of voltage 1.90 V, temperature −25° C., Nch, and process variation information FH, code information 7H is written to the code table 210, and process variation information FH is written to one of the plurality of process variation information registers 222b-1 to 222b-m corresponding to a driver provided on the lower right part of the chip. In this case, process variation information FH is written to one of the process variation information registers 222b-1 to 222b-m corresponding to the driver provided on the lower right position of the chip by the tester 300.

In this arrangement, even when process variations differ in a semiconductor device chip including the driving capability adjustment circuit 200b according to the embodiment, process variations at individual positions can be stored in the plurality of process variation information registers 222b-1 to 222b-m. Thus, in a chip, driving capabilities can be adjusted in a manner that depends on variations in a process, and variations in the driving capabilities can be reduced.

The operations of reading the code table 210 for adjusting a driving capability when the control logic 221b includes the plurality of process variation information registers 222b-1 to 222b-m will next be described.

Figure 18:
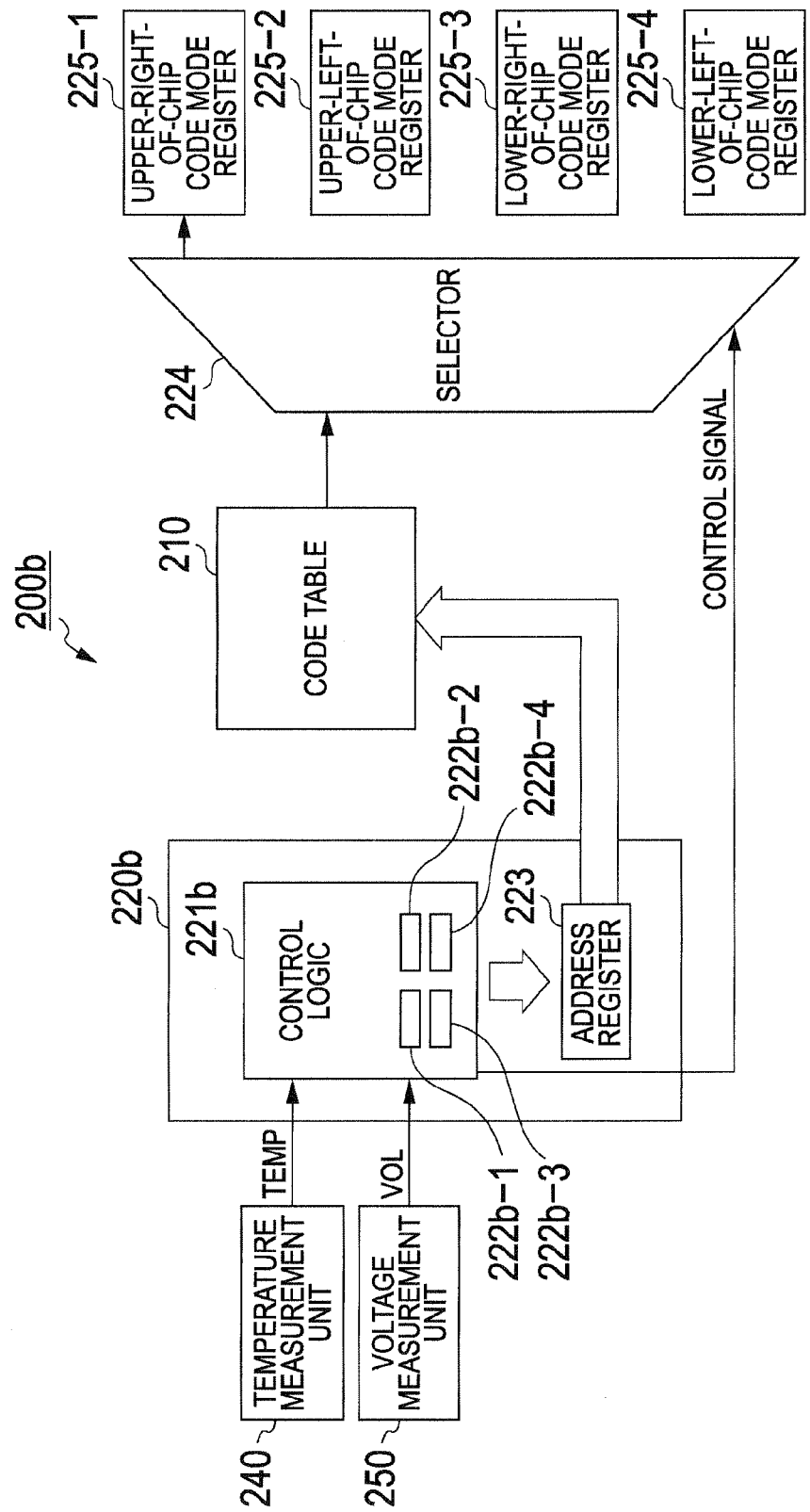
FIG. 18 is a conceptual illustration of the operations of reading the code table for adjusting a driving capability by the control logic having the second configuration.

FIG. 18 is a conceptual illustration of the operations of reading the code table 210 for adjusting a driving capability when the control logic 221b includes the plurality of process variation information registers 222b-1 to 222b-m.

FIG. 18 shows, as an example, a case where the control logic 221b includes the four process variation information registers 222b-1 to 222b-4. The process variation information register 222b-1, out of the four process variation information registers 222b-1 to 222b-4, stores the process variation information of the upper right part of a chip constituting a semiconductor device and is used when a driver for a terminal the driving capability of which is to be adjusted exists at the upper right part of the chip. Moreover, the process variation information register 222b-2 stores the process variation information of the upper left part of a chip and is used when a driver for a terminal the driving capability of which is to be adjusted exists at the upper left part of the chip. The process variation information register 222b-3 stores the process variation information of the lower right part of a chip constituting a semiconductor device and is used when a driver for a terminal the driving capability of which is to be adjusted exists at the lower right part of the chip. The process variation information register 222b-4 stores the process variation information of the lower left part of a chip constituting a semiconductor device and is used when a driver for a terminal the driving capability of which is to be adjusted exists at the lower left part of the chip.

Moreover, the code mode registers 225-1 to 225-4 are provided, corresponding to the process variation information registers 222b-1 to 222b-4. The code mode register 225-1 is a register in which code information to be set in the driver units 230 for adjusting the driving capability of a terminal the driver of which exists at the upper right of a chip of a semiconductor device is set. Moreover, the code mode register 225-2 is a register in which code information to be set in the driver units 230 for adjusting the driving capability of a terminal the driver of which exists at the upper left of a chip of a semiconductor device is set. The code mode register 225-3 is a register in which code information to be set in the driver units 230 for adjusting the driving capability of a terminal the driver of which exists at the lower right of a chip of a semiconductor device is set. The code mode register 225-4 is a register in which code information to be set in the driver units 230 for adjusting the driving capability of a terminal the driver of which exists at the lower left of a chip of a semiconductor device is set.

The selector 224 selects, on the basis of a control signal from the control logic 221, one of the code mode registers 225 in which code information read from the code table 210 is set. The control logic 221 sends, on the basis of the position of a terminal the driving capability of which is to be adjusted, a control signal to the selector 224 so as to cause the selector 224 to select one of the code mode registers 225-1 to 225-4.

Figure 19:
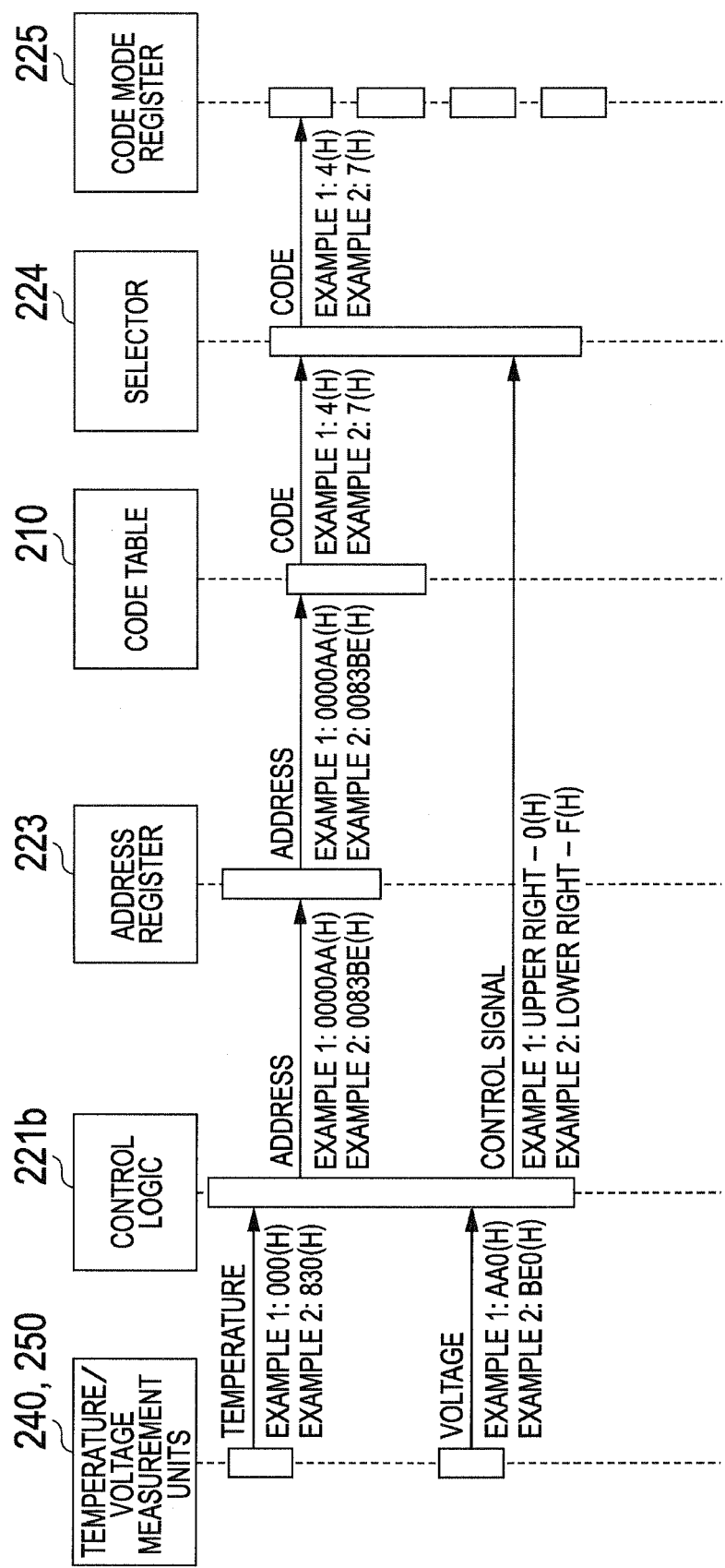
FIG. 19 is a sequence diagram illustrating the operations of the control logic, having the second configuration, reading code information from the code table.

FIG. 19 is a sequence diagram illustrating the operations of the control logic 221b reading code information from the code table 210 when the driving capability adjustment circuit 200b including the plurality of process variation information registers 222b-1 to 222b-4 adjusts a driving capability while a semiconductor device is operating illustrated in FIG. 18.

When a semiconductor device is operating, the information of a temperature and a voltage is indicated to the control logic 221b by the temperature measurement unit 240 and the voltage measurement unit 250 in real time, as illustrated in FIG. 19. Moreover, the control logic 221b reads process variation information set in one of the plurality of process variation information registers 222b-1 to 222b-4 corresponding to the position of a driver for a terminal the driving capability of which is to be adjusted. Then, the control logic 221b generates an address value on the basis of the process variation information, the temperature information, and the voltage information and sets the address value in the address register 223. Code information in a corresponding address in the code table 210 is read on the basis of the register value and input to the selector 224. The control logic 221b outputs, on the basis of the position of the driver for the terminal, the driving capability of which is to be adjusted, a control signal to the selector 224. The selector 224 selects, on the basis of the control signal, one of the plurality of code mode registers 225-1 to 225-n and sets the code information input from the code table 210 in the code mode register. The code information set in each of the code mode registers 225-1 to 225-4 is set in one of the driver units 230 corresponding to a terminal the driving capability of which is to be adjusted, and the driving capability is adjusted.

A first example in FIG. 19 illustrates a case where voltage information is 1.70 V, temperature information is 0° C., a transistor covered by a driver is a Pch transistor, process variation information is 0H, and the position of a driver for a terminal the driving capability of which is to be adjusted is the upper right of a chip. In this case, 000H as temperature information and AA0H as voltage information are indicated to the control logic 221b by the temperature measurement unit 240 and the voltage measurement unit 250, respectively. The control logic 221b generates an address value 0000AAH from these pieces of information, information indicating that a corresponding transistors is a Pch transistor, and process variation information 0H in one of the process variation information registers 222-1 in a case where the position of the driver corresponds to the upper right and sets the address value in the address register 223. Code information 4H is read from the position of the address 0000AAH in the code table 210 and input to the selector 224 by this operation. Moreover, the control logic 221b sends, to the selector 224, 0H indicating the upper right of the chip as a control signal. The selector 224 selects, on the basis of the control signal, the code mode register 225-1 for the upper right and sets the code information input from the code table 210 in the code mode register 225-1.

In this manner, in the driving capability adjustment circuit 200b including the plurality of process variation information registers 222b-1 to 222b-m, adjustment of a driving capability in which process variations in a chip are considered can be implemented. Moreover, this adjustment of a driving capability can be performed more rapidly than a known one and thus can be performed even when a semiconductor device is operating or when data transfer is being performed.

Figure 20:
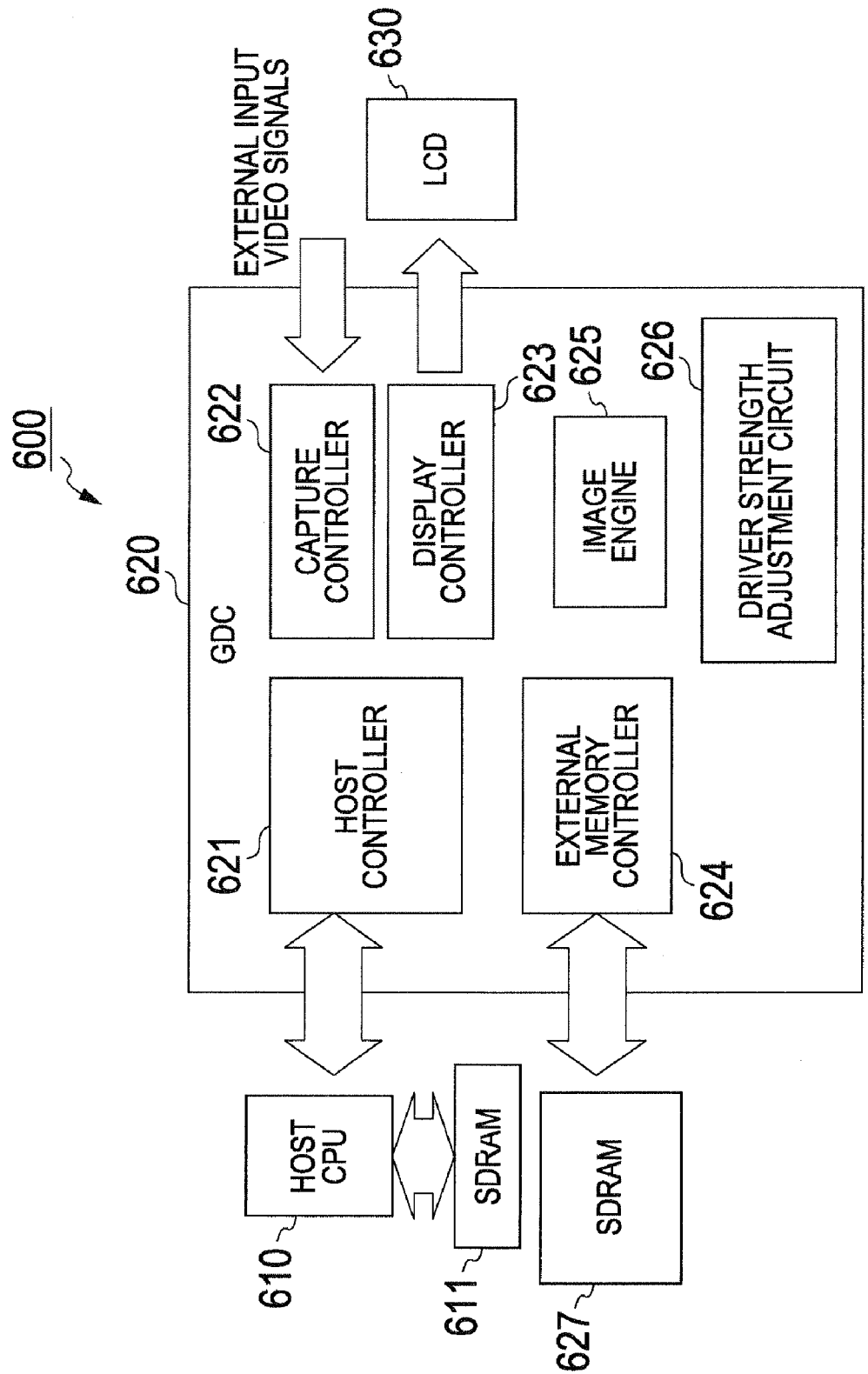
FIG. 20 is a diagram illustrating an exemplary system to which a semiconductor device according to the embodiment is applied.

FIG. 20 is a diagram illustrating an exemplary system to which a semiconductor device according to the embodiment is applied. A system 600 in FIG. 20 includes a Host CPU 610, a graphic display controller (GDC) 620, and an LCD 630. The GDC 620 displays an image on the LCD 630 on the basis of an instruction from the Host CPU 610. The GDC 620, out of these components, includes a driving capability adjustment circuit according to the embodiment.

The Host CPU 610 indicates to the GDC 620 to display an image, using an SDRAM 611 as a work memory. The GDC 620 processes external input video signals on the basis of an instruction from the Host CPU 610 and displays an image on the LCD 630, using an SDRAM 627 connected to the outside as a cache memory.

The GDC 620 includes a host controller 621 interacting with the Host CPU 610, a capture controller 622 receiving external input video signals, a display controller 623 displaying an image on the LCD 630, an external memory controller 624 interacting with the SDRAM 627, an image engine 625 generating image data to be displayed on the LCD 630 by, for example, developing the image data, and a driving capability adjustment circuit 626.

The driving capability adjustment circuit 626 performs the aforementioned adjustment of the respective driving capabilities of terminals of the GDC 620. The respective driving capabilities of the following terminals are to be adjusted: The respective driving capabilities of terminals used between the Host CPU 610 and the host controller 621 where high-speed data transfer is performed, between the display controller 623 and the LCD 630, and between the SDRAM 627 and the external memory controller 624 are adjusted.

The GDC 620 can handle high-speed data transfer, using the driving capability adjustment circuit 626 according to the embodiment. Moreover, even when changes occur in the temperature, the voltage, and the like during the operation of the GDC 620, adjustment of a driving capability in a manner that depends on the changes can be performed.

Changes in output waveforms caused by the method according to the embodiment for adjusting a driving capability will next be described.

Figure 21:
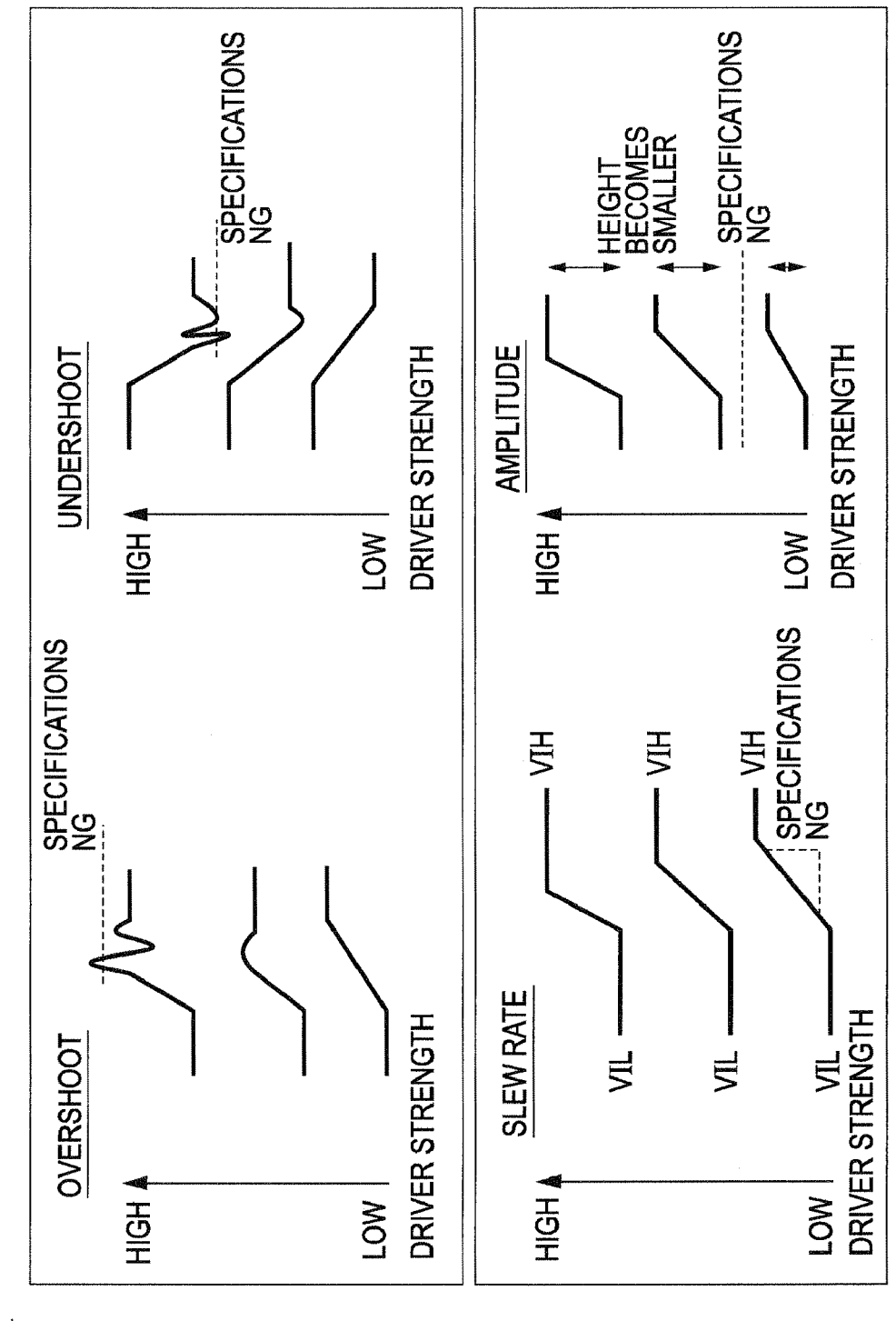
FIG. 21 illustrates a case where various types of problems with output waveforms are solved by adjusting a driving capability.

FIG. 21 illustrates a case where various types of problems with output waveforms are solved by adjusting a driving capability.

When the output waveform of a semiconductor device according to the embodiment overshoots due to changes in the temperature, the voltage, and the like, the output waveform falls within the specifications of a destination semiconductor device by decreasing the driving capability. Moreover, when the output waveform undershoots, the output waveform falls within the specifications of a destination semiconductor device by decreasing the driving capability.

Moreover, when there is a problem with the slew rate, the slew rate falls within the specifications of a destination semiconductor device by increasing the driving capability. When the amplitude of an output signal is low, the amplitude falls within the specifications of a destination semiconductor device by increasing the driving capability.

According to the method of the embodiment, the driving capability can be always maintained constant. Thus, since overshoot/undershoot, the slew rate, and the amplitude can be maintained constant, the quality of an output waveform can be improved.

A change in the timing margin of an output waveform caused by the method according to the embodiment for adjusting a driving capability will next be described.

Figure 22:
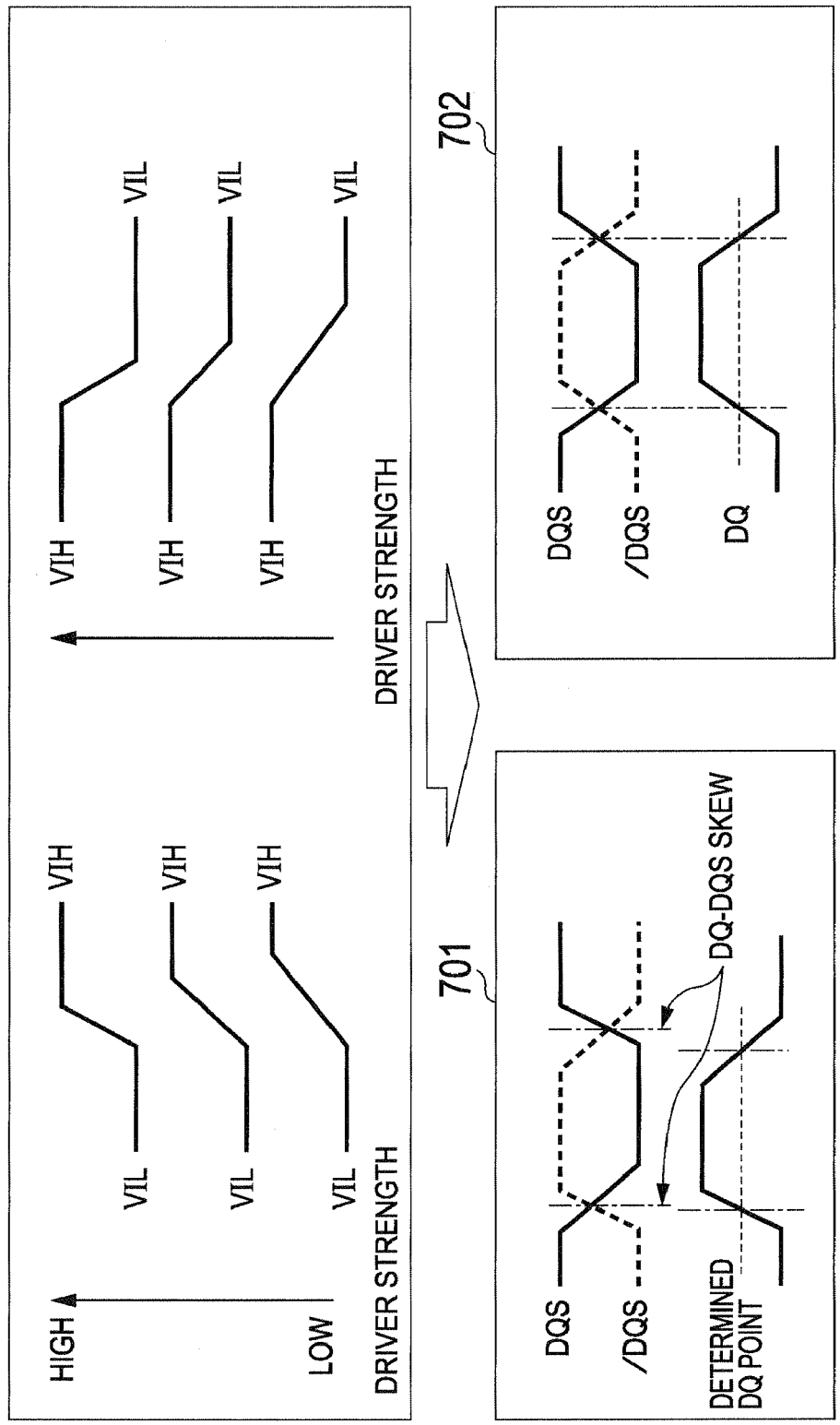
FIG. 22 is a diagram illustrating an improvement in the timing margin achieved by applying a method according to the embodiment for adjusting a driving capability.

FIG. 22 is a diagram illustrating an improvement in the timing margin achieved by applying the method according to the embodiment for adjusting a driving capability.

In known arts, the driving capability changes during the operation. Thus, when a driving capability on the Pch transistor side differs from a driving capability on the Nch transistor side, as illustrated in a known case indicated by 701 in FIG. 22, the timing margin changes in a manner such that the cross points between DQS and /DQS do not coincide with the determined DQ point. Thus, the valid data period decreases by the amount of the DQ-DQS skew.

Regarding the output waveform of a semiconductor device to which the method according to the embodiment for adjusting a driving capability is applied, the driving capability does not change even when changes occur in the temperature, the voltage, and the like during the operation. Thus, the slew rate is maintained constant, and the cross points between activation signals DQS and /DQS do not change.

Thus, the DQ-DQS skew is minimized, and the length of the valid data period is maximized, as illustrated by 702 in FIG. 22. Accordingly, the timing margin is improved. The effect of the method according to the embodiment for adjusting a driving capability on simultaneous switching noise will next be described.

When the method according to the embodiment for adjusting a driving capability is applied, since the driving capability is constant, the height of a driving capability and the slew rate are maintained constant. Thus, regarding simultaneous switching noise, the magnitude of noise for the power, GND, and the like and a period during which the influence of power noise, GND noise, and the like is effective are maintained constant.

Figure 23A:
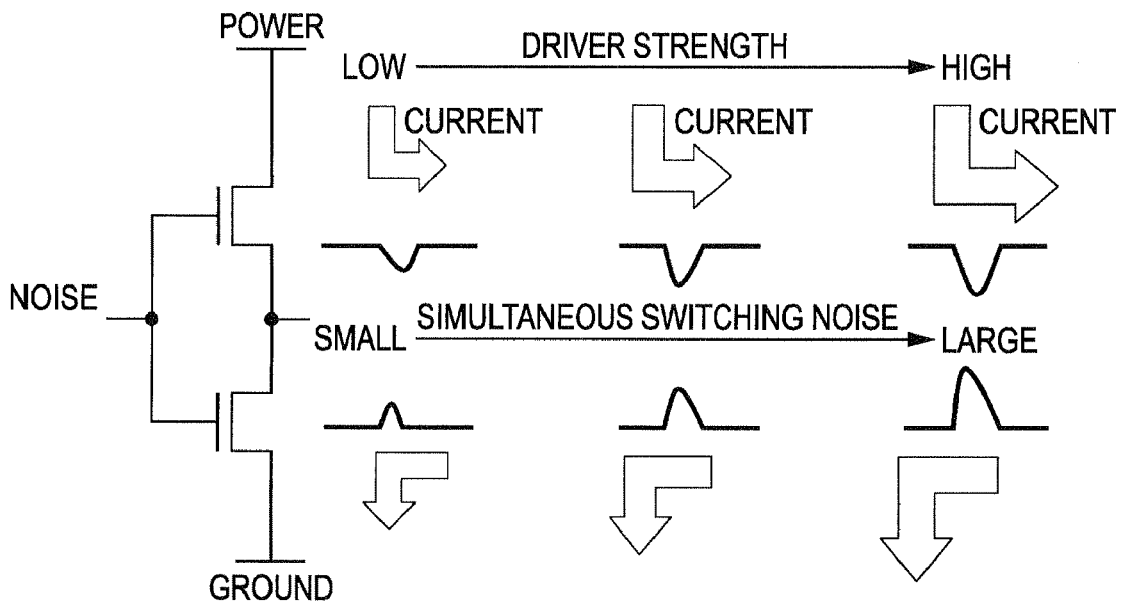
FIGS. 23A and 23B are diagrams illustrating the effect according to the embodiment related to noise and the effect according to the embodiment on the slew rate, respectively.
Figure 23B:
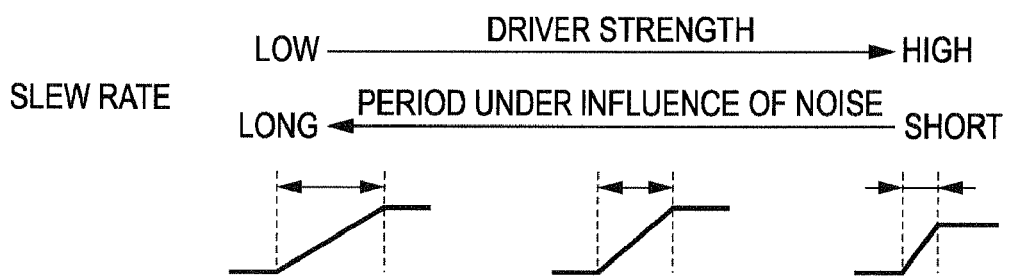

FIG. 23A and FIG. 23B illustrate the effect related to noise and the effect on the slew rate, respectively. When the driving capability is increased, since the amount of current per unit time increases accordingly, simultaneous switching noise increases, as illustrated in FIG. 23A. However, regarding the slew rate, when the driving capability is increased, the length of a period during which the slew rate is affected by noise decreases accordingly, as illustrated in FIG. 23B.

Moreover, when the driving capability is constant, simultaneous switching noise is always constant regardless of changes in the environment. Thus, when the driving capability is constant, an improvement can be achieved in relation to simultaneous switching noise and the influence of the noise on other signals regarding delay.

Moreover, when the method according to the embodiment for adjusting a driving capability is applied, since the driving capability is constant, in addition to the effect on the quality of signals, the aforementioned quality of signals need not be considered in the design and development of a semiconductor device, resulting in relaxation of constraints on the design and development. Thus, the advantage of reducing a design period and design costs can be achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A semiconductor device comprising:
    a driver that receives a power supply voltage and drives an external load with a driving capability;
    a measurement portion that measures a level of the power supply voltage;
    a code table that stores the level of the power supply voltage and code information for determining the driving capability of the driver;
    a register that stores process variation information of the semiconductor device; and
    a controller that
        reads the code information in accordance with the level of a measured power supply voltage in reference to the code table,
        controls the driving capability of the driver in accordance with the code information,
        reads the code information in accordance with the level of the measured power supply voltage and the process variation information stored in the register,
        generates an address of the code table in accordance with the measured supply voltage and process variation information stored in the register, and
        refers to the code table by using the address.

2. The semiconductor device of claim 1, wherein the code information includes a plurality of codes corresponding to plural levels of the power supply voltage.

3. The semiconductor device of claim 1, wherein the register stores the process variation information for each semiconductor wafer in which the semiconductor device is formed.

4. The semiconductor device of claim 1, the controller includes a plurality of register which each store the process variation information for each position of the driver and refers to the code table in accordance with the position of the driver.

5. The semiconductor device of claim 1, wherein the controller changes number of the transistors constituting each channel of the driver in accordance with the code information.

6. A semiconductor device comprising:
 a driver that receives a power supply voltage and drives an external load with a driving capability;
 a measurement portion that measures a level of the power supply voltage;
 a code table that stores the level of the power supply voltage, a channel of transistors constituting the driver, and the process variation information corresponding to the code information, and determines the driving capability of the driver; and
 a controller that reads the code information in accordance with the level of a measured power supply voltage in reference to the code table and controls the driving capability of the driver in accordance with the code information.

7. A method of adjusting a driving capability of a driver for receiving a power supply voltage and driving an external load with the driving capability, comprising:
 measuring a level of the power supply voltage;
 referring a code table which stores the level of the power supply voltage, code information, a channel of transistors constituting the driver, and the process variation information corresponding to the code information, for determining the driving capability of the driver;
 reading the code information in accordance with the level of the measured supply voltage in reference to the code table; and
 controlling the driving capability of the driver in accordance with the code information read out.

\* \* \* \* \*